(12) United States Patent
Chae et al.

(10) Patent No.: US 7,646,041 B2
(45) Date of Patent: Jan. 12, 2010

(54) NON-VOLATILE MEMORY DEVICES INCLUDING VERTICAL CHANNELS, METHODS OF OPERATING, AND METHODS OF FABRICATING THE SAME

(75) Inventors: Soo-Doo Chae, Yongin-si (KR); Chung-Woo Kim, Suwon-si (KR); Chan-Jin Park, Yongin-si (KR); Jeong-Hee Han, Hwaseong-si (KR); Byung-Gook Park, Seoul (KR); Il-Han Park, Goyang-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 11/999,135

(22) Filed: Dec. 4, 2007

(65) Prior Publication Data

US 2008/0128757 A1   Jun. 5, 2008

(30) Foreign Application Priority Data

Dec. 4, 2006   (KR) .................. 10-2006-0121228
Sep. 20, 2007  (KR) .................. 10-2007-0095665
Nov. 29, 2007  (KR) .................. 10-2007-0123002

(51) Int. Cl.
*H01L 27/108* (2006.01)

(52) U.S. Cl. .................. 257/204; 257/296; 257/316; 257/E27.091; 257/E27.096; 257/E27.097; 438/514; 438/257; 438/259

(58) Field of Classification Search .................. 257/314, 257/315, 316, 324, 328, 368, 506, 509, 510, 257/513, 519, E27.084, E27.085, E27.07, 257/E27.096, E27.098, E27.102, E21.661, 257/E21.662, E21.68, E21.69, E29.3, 302, 257/330–334, E29.131, E29.646, E29.692, 257/E29.693, E29.676, E27.091, E27.097, 257/E21.693; 438/257, 259
See application file for complete search history.

(56) References Cited

U.S. PATENT DOCUMENTS

| | | | | |
|---|---|---|---|---|
| 6,072,722 A | * | 6/2000 | Hirano | .................. 365/185.13 |
| 6,211,015 B1 | | 4/2001 | Noble | |
| 6,486,027 B1 | * | 11/2002 | Noble et al. | .................. 438/259 |
| 2001/0053575 A1 | | 12/2001 | Noble | |

FOREIGN PATENT DOCUMENTS

KR   100697291 B1   3/2007

\* cited by examiner

*Primary Examiner*—A. Sefer
*Assistant Examiner*—Ermias Woldegeorgis
(74) *Attorney, Agent, or Firm*—Myers Bigel Sibley & Sajovec, P.A.

(57) ABSTRACT

A flash memory device can include a semiconductor fin protruding from a semiconductor substrate of a first conductive type to extend in one direction, a first doped layer and a second doped layer provided to an upper portion and a lower portion of the semiconductor fin, respectively, to be vertically spaced apart from each other, the first and second doped layers having a second conductive type, and a plurality of word lines extending over a top and a sidewall of the semiconductor fin to intersect the direction. The word lines overlap the first doped layer and the second doped layer to have vertical channels.

12 Claims, 43 Drawing Sheets

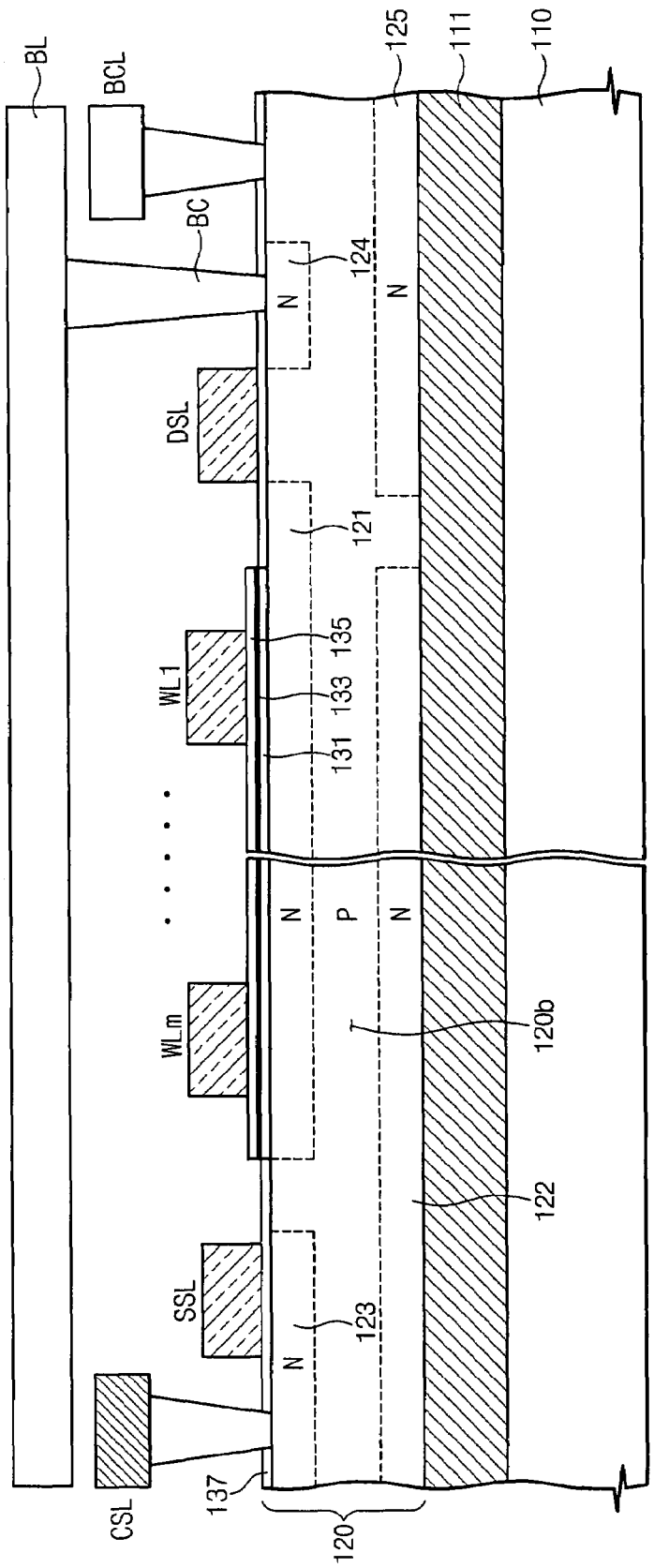

Fig. 15

| | Program | Erase | Read |
|---|---|---|---|
| SSL | Vcc | Float | Vcc |
| BIL | Vcc | Float | Vcc |
| WL(Selected) | Vpgm | 0 | Vcc |
| WL(Unselected) | 0 | - | 0 |
| GSL | 0 | Float | Vcc |
| CSL | 0 | Float | 0 |
| BL(Selected) | 0 | Float | Vread |
| BL(Unselected) | Vcc | Float | 0 |
| Bulk | 0 | Vers | 0 |

NON-VOLATILE MEMORY DEVICES INCLUDING VERTICAL CHANNELS, METHODS OF OPERATING, AND METHODS OF FABRICATING THE SAME

CROSS-REFERENCE TO RELATED APPLICATIONS

This U.S. non-provisional patent application claims priority under 35 U.S.C. § 119 of Korean Patent Application Nos. 2006-121228, 2007-95665, and 2007-123002 filed Dec. 4, 2006, Sep. 20, 2007, and Nov. 29, 2007, respectively, in the Korean Intellectual Property Office, the entire contents of which are hereby incorporated by reference.

FIELD OF INVENTION

The present invention disclosed herein relates to a non-volatile memory device and method of operating the same, and more particularly, to a flash memory device with a vertical channel and method of operating the same.

BACKGROUND

Recently, as mobile and multi-media industries have been developed, a demand on a flash memory device has increase. The flash memory device can be extensively used in devices capable of storing and occasionally updating system BIOSs of a networking device (e.g., a router, a hub, etc.), a mobile phone, a personal digital assistant (PDA), etc. The flash memory device also can be utilized in a memory card, a digital camera, a sound/image storage device, a solid state memory (SSD), a portable computer, etc.

Flash memory devices can be NAND type or NOR type. The NAND type has a disadvantageous random access characteristic during a read operation, but is advantageous for the high degree of integration and also is capable of performing a write operation through F-N tunneling. Therefore, the NAND type has low power consumption and is mainly used for a high capacity memory. The NOR type has the less degree of integration compared to the NAND type, and makes use of channel hot electron (CHE) injection during a write operation. Therefore, the NOR type has high power consumption, but performs a fast read operation through better random access characteristics. Thus, the NOR type may be used in a code memory of a mobile device.

To overcome the above limitations of the NAND and NOR flash memory device, U.S. Pat. No. 6,072,722 discusses an AND type in another form of a flash memory device. In a typical AND memory device, since memory cells are connected in parallel between a local bit line LBL and a local source line LSL, a write operation is possible through F—N tunneling. Therefore, the typical AND memory device has low power consumption during a write operation and performs a fast read operation. However, since the typical AND flash memory device arranges the local bit line LBL and the local source line LSL in a plane, a high degree of integration may be difficult to achieve. Furthermore, the AND flash memory device needs to apply a high write prohibit voltage to all bit lines not in use to reduce the likelihood of disturbing memory cells that shares a word line during a write operation.

SUMMARY

Embodiments of the present invention can provide flash memory devices including: a local bit line connected to a bit line on a semiconductor substrate having a first conductive type; a local source line connected to a common source line intersecting the bit line; and a plurality of memory cells connected in parallel to the local bit line and the local source line. The local bit line and the local source line are vertically spaced apart from each other in the semiconductor substrate and are a first doped layer and a second doped layer, respectively, the first and second doped layers having a second conductive type.

In some embodiments, the devices further include: a first select transistor connecting the bit line with the local bit line; a second select transistor connecting the common source line with the local source line; a drain select line and a source select line connected to the first select transistor and the second select transistor, respectively, and arranged to intersect the bit line; and a plurality of word lines connected to the memory cells to intersect the bit line, between the drain select line and the source select line.

In some embodiments, the devices further include a semiconductor fin protruding from the semiconductor substrate to extend in one direction and having the top and the side, wherein the doped layers of the local bit line and the local source line extend along the direction at an upper portion or a lower portion of the semiconductor fin; and the word lines, the drain select line, and the source select line extend over the top and the side surface of the semiconductor fin to intersect the direction.

In some other embodiments, the devices further include a tunnel insulating layer, a charge storage layer, and a blocking insulating layer between the word lines and the semiconductor fin.

In some embodiments, the devices further include an isolation insulating layer provided between the lower portion of the semiconductor fin and lower portions of other semiconductor fins adjacent to the semiconductor fin to extend along the direction, wherein the word lines, the drain select line, and the source select line extend over the isolation insulating layer.

In some embodiments, the devices further include a third doped layer and a fourth doped layer spaced apart from each other at both sides of the first doped layer on the semiconductor fin, the third and fourth doped layers having a second conductive type, wherein the first doped layer is provided at the upper portion of the semiconductor fin, and the second doped layer is provided at the lower portion of the semiconductor fin; the word lines overlap the first doped layer and the second doped layer; the source select line overlaps the second doped layer and the third doped layer; and the drain select line is provided between the first doped layer and the fourth doped layer.

In some embodiments, the devices further include: a body isolation line extending over the top surface and the side surface of the semiconductor fin to intersect the direction and overlapping the first doped layer and the second doped layer to deplete a body region between the first doped layer and the second doped layer, between the drain select line and the word line that is the most adjacent to the drain select line.

In some embodiments, the devices further include a third doped layer spaced apart from the first doped layer and having a second conductive type at the upper portion of the semiconductor fin, and a fourth doped layer spaced apart from the second doped layer and having a second conductive type at the lower portion of the semiconductor fin, wherein the first doped layer is provided at the upper portion of the semiconductor fin, and the second doped layer is provided at the lower portion of the semiconductor fin; the word lines overlap the first doped layer and the second doped layer; the source select line overlaps the second doped layer and the third doped layer; and the drain select line overlaps the first doped layer and the fourth doped layer.

In some embodiments, the devices further include a fourth doped layer spaced apart from the first doped layer and having a second conductive type at the upper portion, and a third doped layer spaced apart from the second doped layer and having a second conductive type at the lower portion of the semiconductor fin, wherein the first doped layer is provided at the upper portion of the semiconductor fin, and the second doped layer is provided on the lower portion of the semiconductor fin; the word lines overlap the first doped layer and the second doped layer; the source select line is provided between the second doped layer and the third doped layer; and the drain select line is provided between the first doped layer and the fourth doped layer.

In some embodiments, the first doped layer is provided at the upper portion of the semiconductor fin, and the second doped layer is provided at the lower portion of the semiconductor fin; and the semiconductor substrate includes a buried insulating layer, the buried insulating layer being provided at the lower portion of the semiconductor fin to electrically insulate the semiconductor fin from other semiconductor fins adjacent to the semiconductor fin, and contacting the bottom of the second doped layer.

In some embodiments, the devices further include: a third doped layer and a fourth doped layer spaced apart in the both sides of the first doped layer at the upper portion of the semiconductor fin; and a fifth doped layer spaced apart from the second doped layer and contacting the top of the buried insulting layer at the lower portion of the semiconductor fin, wherein the word lines overlap the first doped layer and the second doped layer; the source select line overlaps the second doped layer and the third doped layer; and the drain select line is provided between the first doped layer and the fourth doped layer and overlaps the fifth doped layer.

In some embodiments, the devices further include a fourth doped layer spaced apart from the second doped layer and having a second conductive type at the upper portion of the semiconductor fin, and a fifth doped layer extending from the third doped layer toward the top surface of the semiconductor fin and having a second conductive type, wherein the word lines overlap the first doped layer and the second doped layer; the source select line overlaps the second doped layer and the third doped layer; and the drain select line overlaps the first doped layer and the fourth doped layer.

In some embodiments, the devices further include: a body isolation line extending over the top and the side of the semiconductor fin to intersect the direction and overlapping the first doped layer and the second doped layer to deplete a body region between the first doped layer and the second doped layer, between the source select line and the word line that is the most adjacent to the source select line.

In some embodiments, the width of the semiconductor fin ranges from about 40 nm to about 60 nm.

In some embodiments of the present invention, flash memory devices include: a semiconductor fin protruding from a semiconductor substrate of a first conductive type to extend in one direction and having the top surface and the side surface; a first doped layer and a second doped layer provided to an upper portion and a lower portion of the semiconductor fin, respectively, to be vertically spaced apart from each other and exposed to the side of the semiconductor fin, the first and second doped layers having a second conductive type; and a plurality of word lines extending over the top and the side of the semiconductor fin to intersect the direction and including a tunnel insulating layer, a charge storage layer, and a blocking insulating layer between the semiconductor fins, wherein the word lines overlap the first doped layer and the second doped layer to have vertical channels.

In some embodiments, the devices further include: a source select line and a drain select line extending to intersect the direction at the both sides of the word lines; a common source line connected to the semiconductor fin at one side of the source select line opposite to the word lines; and a bit line connected to the semiconductor fin at the other side of the drain select line opposite to the word lines, wherein the first doped layer and the second doped layer are a local bit line and a local source line, respectively, the local bit line connecting in parallel memory cells connected to the word lines with the bit line, the local source line connecting in parallel the memory cells with the common source line, the local bit line and the local source line constituting an AND flash memory.

In some embodiments, the devices further include: a body isolation line extending over the top and the side of the semiconductor fin to intersect the direction and overlapping the first doped layer and the second doped layer to deplete a body region between the first doped layer and the second doped layer, between the outmost word line and the select line adjacent to the outmost word line.

In some embodiments, the first doped layer and the second doped layer are a bit line and a common source line, respectively, the bit line and the common source line constituting a NOR flash memory.

In some embodiments of the present invention, methods of operating an AND flash memory device, the AND flash memory device including a plurality of bit lines, a local bit line connected to each of the bit lines through a first select transistor controlled by a drain select line, common source line, a local source line connected to each of the commons source line through a second select transistor controlled by a source select line, and a plurality of memory cells connected in parallel to the local bit line and the local source line and controlled by word lines on a semiconductor substrate, include: by applying a first voltage to the drain select line, a second voltage lower than the first voltage to the bit line connected to selected memory cell to turn on the first select transistor, a third voltage equal to or higher than the first voltage to the bit lines connected to unselected memory cells, a fourth voltage higher than the second voltage to the word line connected to the selected memory cell, a fifth voltage equal to or higher than the second voltage or lower than the fourth voltage to the word lines connected to the unselected memory cells, the second voltage to the source select line to turn off the second select transistor, the second voltage to the common source line, and a ground voltage to the semiconductor substrate, floating a body region of the selected memory cell from electric potential of the semiconductor substrate to program the selected memory cell.

In some embodiments, a sixth voltage is applied to the body isolation line to completely deplete a body region of a semiconductor fin surrounded by the body isolation line.

In some embodiments, the methods further include, by applying a seventh voltage to word lines of memory cells in a specific block including the selected memory cell and disposed between the drain select line and the source select line not to completely deplete a body region of the memory cells in the specific block and an eighth voltage higher than the seventh voltage to the semiconductor substrate to move electron hoes through F-N tunneling in the body region of the memory cells in the specific block, and floating the remaining lines, simultaneously erasing the memory cells in the specific block.

In some embodiments, the methods further include, by applying a ninth voltage to the body isolation line not to completely deplete the body region of the semiconductor fin surrounded by the body isolation line, a tenth voltage higher than a ground voltage to the source select line to turn on the second select transistor, an eleventh voltage higher than the ground voltage to a word line connected to the selected memory cell, the first voltage higher than the ground voltage to the drain select line to turn on the first select transistor, a twelfth voltage higher than the ground voltage to a bit line connected to the selected memory cell, and the ground voltage to the common source line, word lines connected to the unselected memory cell, unselected bit lines, and the semiconductor substrate, reading the selected memory cell.

In some embodiments, the fifth voltage and the ninth voltage apply the ground voltage.

In some embodiments of the present invention, methods of operating an NOR flash memory device, the methods further include, by applying a program voltage to a word line of selected memory cell, a floating or ground voltage to word lines of unselected memory cells and unselected bit lines, a first write voltage higher than the ground voltage to a bit line connected to the selected memory cell, and the ground voltage to the common source line, programming the charge storage layer on the drain of the selected memory cell through a channel hot electron injection method.

In some embodiments, the methods further include, by applying a program voltage to a word line of selected memory cell, a floating or ground voltage to word lines of unselected memory cells and unselected bit lines, the ground voltage is applied to a bit line connected to the selected memory cell, and a second write voltage higher than the ground voltage to the common source line, programming the charge storage layer on the source of the selected memory cell through a channel hot electron injection method.

In some embodiments, the second doped layer of the semiconductor fin and the second doped layer of other semiconductor fins are electrically insulated from each other through grooves between the semiconductor fin and other semiconductor fins adjacent to the semiconductor fin, and a body region of the semiconductor fin and body regions of other semiconductor fins are independently biased.

In some embodiments according to the present invention, a first doped layer and a second doped layer are perpendicularly spaced apart from each other in a semiconductor fin extending in one direction. Since the first and second doped layers are used as a local bit line and a local source line of an AND flash memory device, respectively, its degree of integration can be improved. Furthermore, as the present invention appropriately adjusts the width of the semiconductor fin, a body region of a memory cell in the semiconductor fin may be more readily depleted. Therefore, disturbance of adjacent cells can be removed during a write operation without a high voltage transistor or a peripheral circuit.

As the first doped layer and the second doping layer are used as a bit line and a common source line of a NOR flash memory device, respectively, the degree of integration in the NOR flash memory device can be improved. Furthermore, as both sides of the semiconductor fin are used as vertical channels, a 2-bit operation is possible and read disturbance can be reduced. Therefore, reliability of a program can be improved.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures:

FIGS. 2A through 2C are sectional views taken along line I-I' of FIG. 1B according to an embodiment of the present invention;

FIG. 15 is a table illustrating exemplary methods of operating an AND flash memory device according an embodiment of the present invention.

DESCRIPTION OF EMBODIMENTS

Figure 1A:
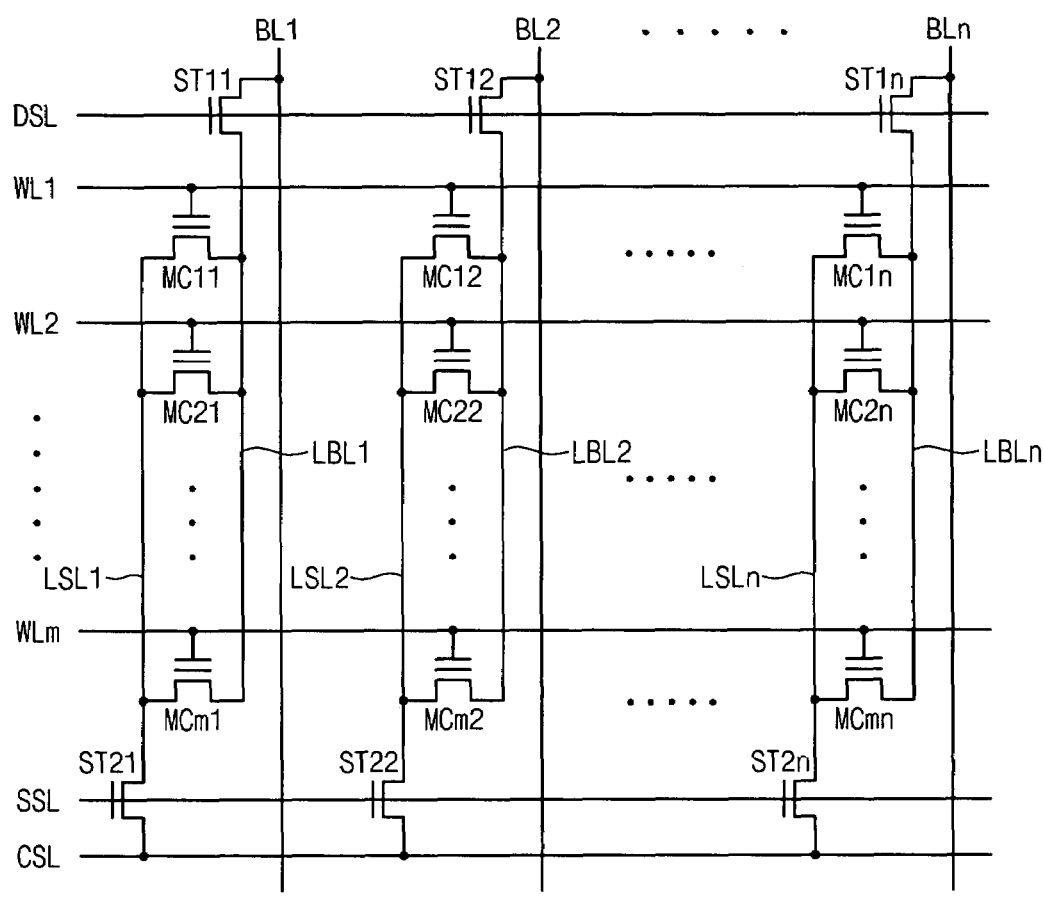
FIGS. 1A through 1C are a circuit diagram, a layout, and a perspective view, respectively, of an AND flash memory device according to an of the present invention.
Figure 1B:
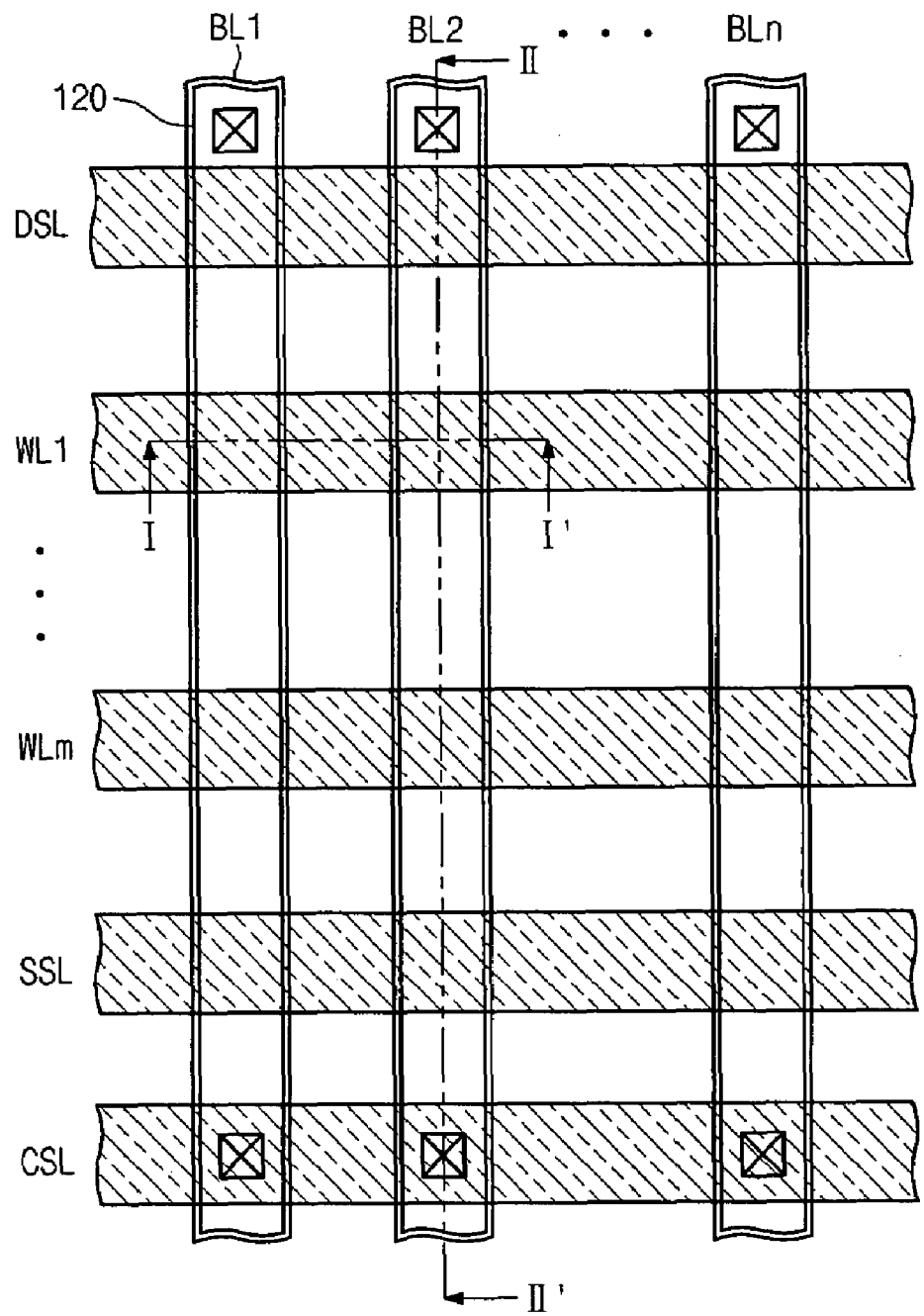
Figure 1C:
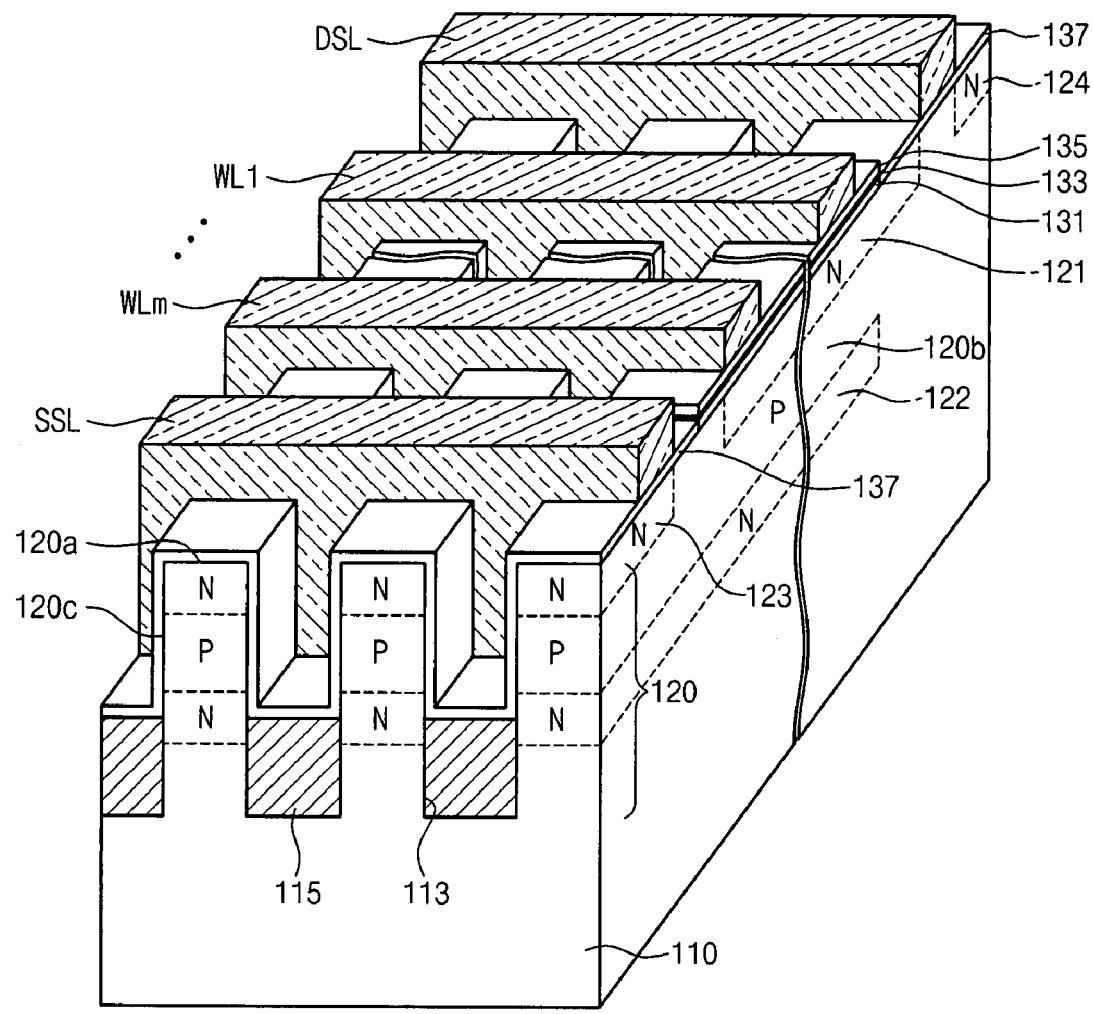
Figure 1D:
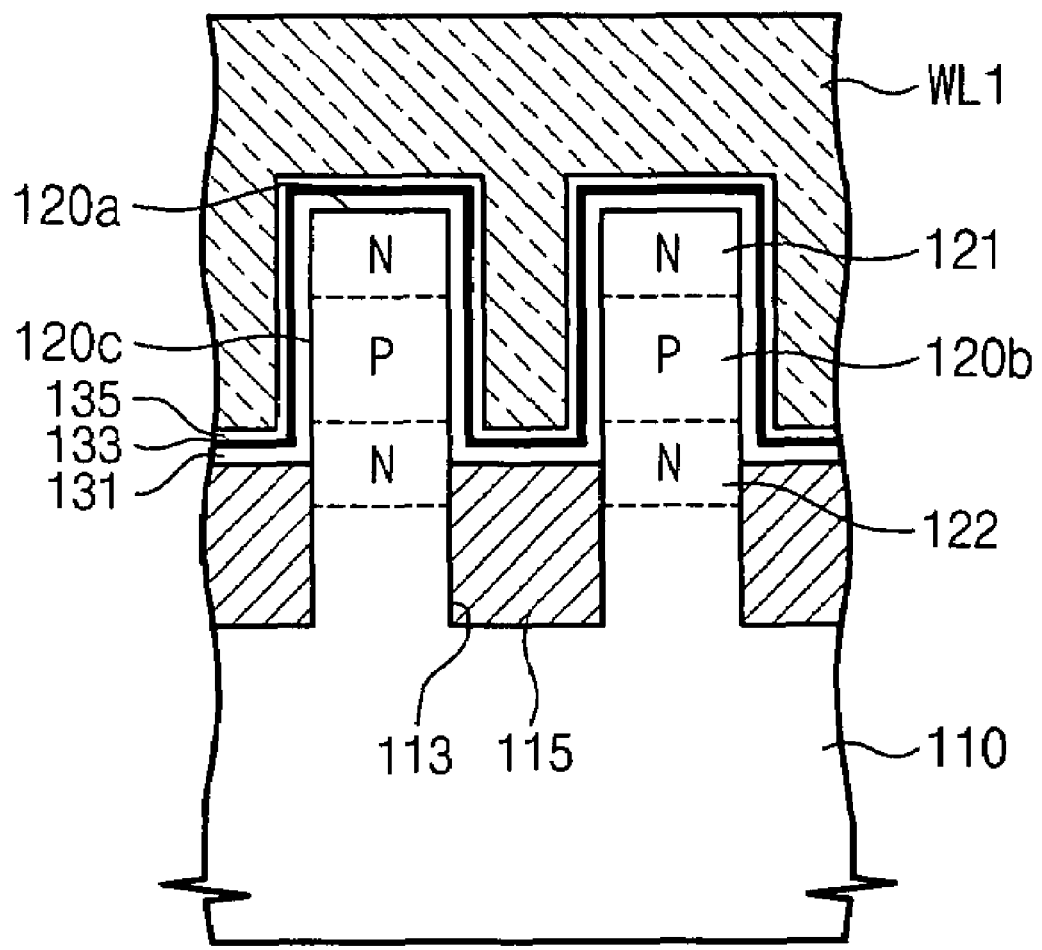
FIGS. 1D and 1E are sectional views taken along line I-I' and line II-II' of FIG. 1B, respectively.
Figure 1E:
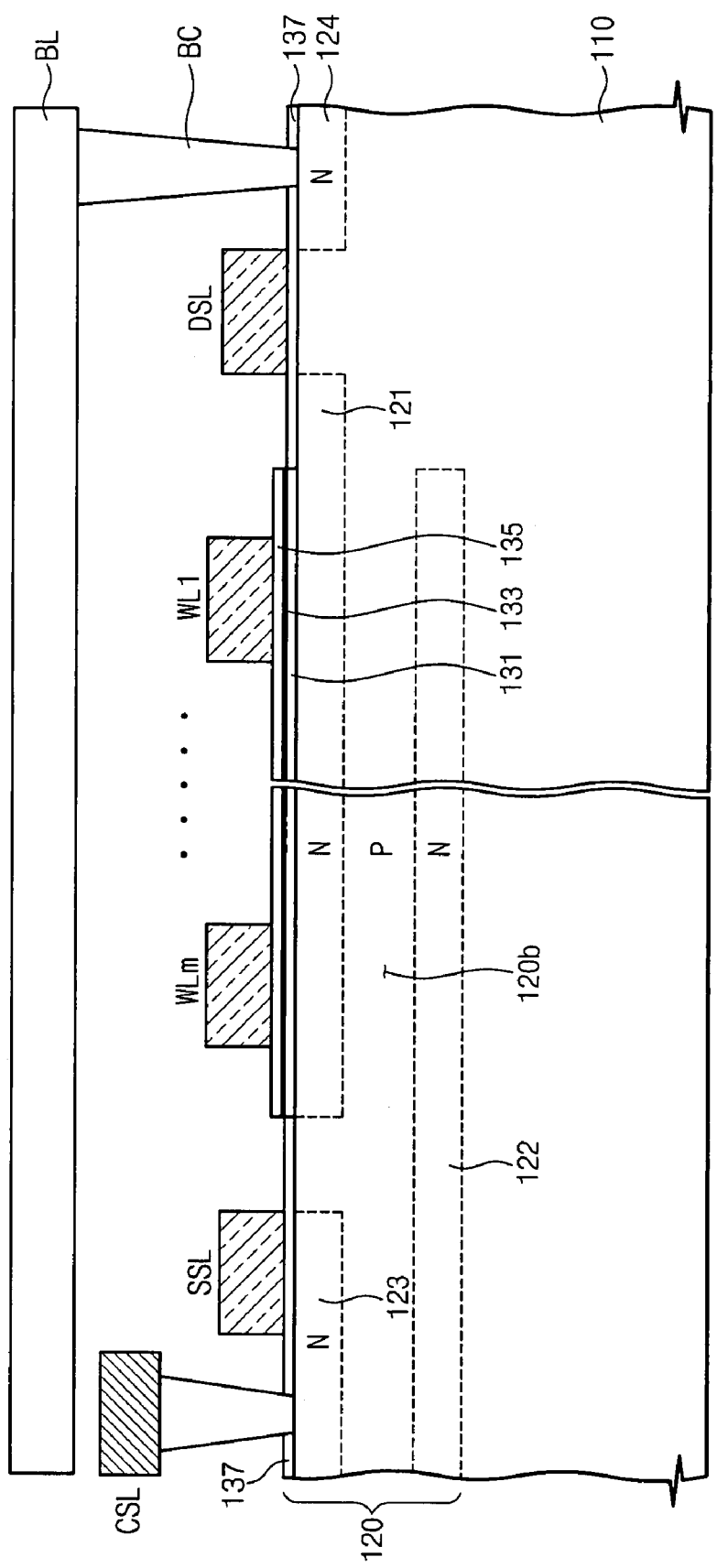

It will be understood that when an element is referred to as being "connected to," "coupled to" or "responsive to" (and/or variants thereof) another element, it can be directly connected, coupled or responsive to the other element or intervening elements may be present. In contrast, when an element is referred to as being "directly connected to," "directly coupled to" or "directly responsive to" (and/or variants thereof) another element, there are no intervening elements present. Like numbers refer to like elements throughout. As used herein, the term "and/or" includes any and all combinations of one or more of the associated listed items and may be abbreviated as "/".

It will be understood that when an element such as a layer, region or substrate is referred to as being "on" another element, it can be directly on the other element or intervening elements may also be present. It will be understood that when an element is referred to as being "connected" or "coupled" to another element, it can be directly connected or coupled to the other element or intervening elements may be present. It will be understood that if part of an element, such as a surface of a conductive line, is referred to as "outer," it is closer to the outside of the substrate than other parts of the element. Furthermore, relative terms such as "under" may be used herein to describe a relationship of one layer or region to another layer or region relative to a substrate or base layer as illustrated in the figures. It will be understood that these terms are intended to encompass different orientations of the device in addition to the orientation depicted in the figures.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising" (and/or variants thereof), when used in this specification, specify the presence of stated features, integers, steps, operations, elements, and/or components, but do not preclude the presence or addition of one or more other features, integers, steps, operations, elements, components, and/or groups thereof. In contrast, the term "consisting of" (and/or variants thereof) when used in this specification, specifies the stated number of features, integers, steps, operations, elements, and/or components, and precludes additional features, integers, steps, operations, elements, and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and the present application, and will not be interpreted in an idealized or overly formal sense unless expressly so defined herein.

Referring to FIGS. 1A through 5C, the flash memory device includes a semiconductor fin 120. The semiconductor fin 120 protrudes from a semiconductor substrate 110 having a first conductive type, e.g., a p-conductive type and extending in one direction (such as in a lateral direction whereas the pin 120 extends in a vertical direction according to FIG. 1B). Also, the semiconductor fin 120 includes a top surface and a side surface. The semiconductor fin 120 may have the first conductive type. A first doping layer 121 and a second doping layer 122 are a second conductive type, e.g., an n-conductive type, opposite to the first conductive type. It will be understood that the term "doping" used in association with "layer" (such as "doping layer" can refer to layers that have been doped with an impurity (such as a n-type or p-type impurity). Accordingly, the term "doping layer" is sometimes used herein to refer to a doped layer.

The first and second doping layers 121 and 122 are formed at the upper portion and the lower portion of the semiconductor fin, respectively. The first and second doping layers 121 and 122 are vertically spaced apart from each other, and extend along the direction. The first and second doping layers 121 and 122 may be exposed at the side surface of the semiconductor fin 120. The semiconductor fin 120 between the first doping layer 121 and the second doping layer 122 is a body region 120b having the first conductive type. The sides of the body region 120b may define and function as a vertical channel of a transistor.

The flash memory device includes a plurality of word lines WL1, WL2, WLm that extend over the top surface and side surface of the semiconductor fin 120 to intersect the direction. The word lines WL1, WL2, . . . , WLm overlap the first and second doping layers 121 and 122. A tunnel insulating layer 131, a charge storage layer 133, and a blocking insulating layer 135 are interposed between the word lines WL1, WL2, . . . , WLm and the semiconductor fin 120. The tunnel insulating layer 131 may be a silicon oxide layer. The charge storage layer 133 may be a charge trap layer. The charge trap layer can be a dielectric layer having a site to trap charges therein, and may be an insulating layer including a silicon nitride layer, $Al_2O_3$ layer, $HfO_2$ layer, HfAlO layer, HfSiON layer, and/or a nano dot. The nano dot may include nano crystalline silicon, nano crystalline silicon germanium, and/or nano crystalline metal. The blocking insulating layer 135 may include a silicon oxide layer, a silicon nitride layer, $Al_2O_3$, hafnium aluminate, HfAlO, HfAlON, hafnium silicate, HfSiO, and/or HfSiON.

According to an embodiment of the present invention, the flash memory device may be an AND type. Referring to FIGS. 1A through 1E, the AND flash memory device includes a source select line SSL and a drain select line DSL extending to intersect the direction on opposing sides of the plurality of the word lines WL1, WL2, . . . , WLm, a common source line CSL connected to the semiconductor substrate 110 at one side of the source select line SSL opposite to the word lines WL1, WL2, . . . , WLm, bit lines BL1, BL2, . . . , BLn connected to the semiconductor substrate 110 on other side of the drain select line DSL opposite to the word lines WL1, WL2, . . . , WLm, first select transistors ST11, ST12, . . . , ST1n connected to the bit lines BL1, BL2, . . . , BLn and the local bit lines LBL1, LBL2 . . . , LBLn, and second select transistors ST21, ST22, . . . , ST2n connected to the common source line CLS and the local source lines LSL1, LSL2, . . . , LSLn. The drain select line DSL is connected to the first select transistor and extends to intersect the bit lines, and the source select line SSL is connected to the second select transistor and extends to intersect the bit lines. The word lines WL1, WL2, . . . , WLm connected to the memory cells extend to intersect the bit lines, between the drain select line DSL and the source select line SSL.

The first doping layer 121 may be provided at the upper portion of the semiconductor fin 120, and the second doping layer 122 may be provided at the lower portion of the semiconductor fin 120. The first doping layer 121 may be the local bit lines LBL1, LBL2, . . . , LBLn that connect in parallel the bit lines BL1, BL2, . . . , BLn with the memory cells MC11, MC12, . . . , MCmn connected to the word lines WL1, WL2, . . . , WLm. The second doping line 122 may be the local source lines LSL1, LSL2, . . . , LSLn that connect in parallel the common source line CSL with the memory cells MC11, MC12, . . . , MCmn. The AND flash memory device includes a third doping layer 123 and a fourth doping layer 124 of a second conductive type, which are spaced apart from each other at both sides of the first doping layer 121 at the upper portion of the semiconductor fin 120. The third doping layer 123 may be a source region of the second select transistors ST21, ST22, . . . , STn, and the fourth doping layer 124 may be a drain region of the first select transistors ST11, ST12, ST1n. The first doping layer 121 may partially overlap the second doping layer 122. The third doping layer 123 may partially overlap the second doping layer 122.

An isolation insulating layer 115 may be provided between the lower portion of the semiconductor fin 120 and the lower portions of other semiconductor fins adjacent to the semiconductor fin 120, i.e., at the lower portions of grooves between the semiconductor fin 120 and other semiconductor fins adjacent to the semiconductor fin 120. The isolation insulating layer 115 partially covers the second doping layer 122 to expose the upper side surface of the second doping layer 122.

The word lines WL1, WL2, . . . , WLm overlap the first doping layer 121 and the second doping layer 122, and the source select line SSL overlaps the second doping layer 122 and the third doping layer 123 to allow their transistors to have vertical channels. The drain select line DSL is provided between the first doping layer 121 and the fourth doping layer 124 to allow its transistor to have horizontal channel. The word lines WL1, WL2, . . . , WLm, the drain select line DSL, and the source select line SSL intersect the direction, and then extend over the top surface 120a and the side surface 120c of the semiconductor fin 120, and over the isolation insulating layer 115. A gate insulating layer 137 is interposed between the drain select line DSL and the semiconductor fin 120, the source select line SSL and the semiconductor fin 120. The gate insulating layer 137 may be a gate insulating layer of the first select transistors ST11, ST12, . . . , ST1n and the second select transistors ST21, ST22, . . . , ST2n. The bit line BL is connected to the fourth doping layer 124 that is a drain region of the first select transistors ST11, ST12, . . . , ST1n through a bit line contact BC. The common source line CSL is connected to the third doping layer 1123 that is a source region of the second select transistors ST21, ST22, . . . , ST2n. Since the memory cells have the vertical channels, the degree of integration in the memory cells can be improved, compared to a typical memory cell.

Figure 2A:
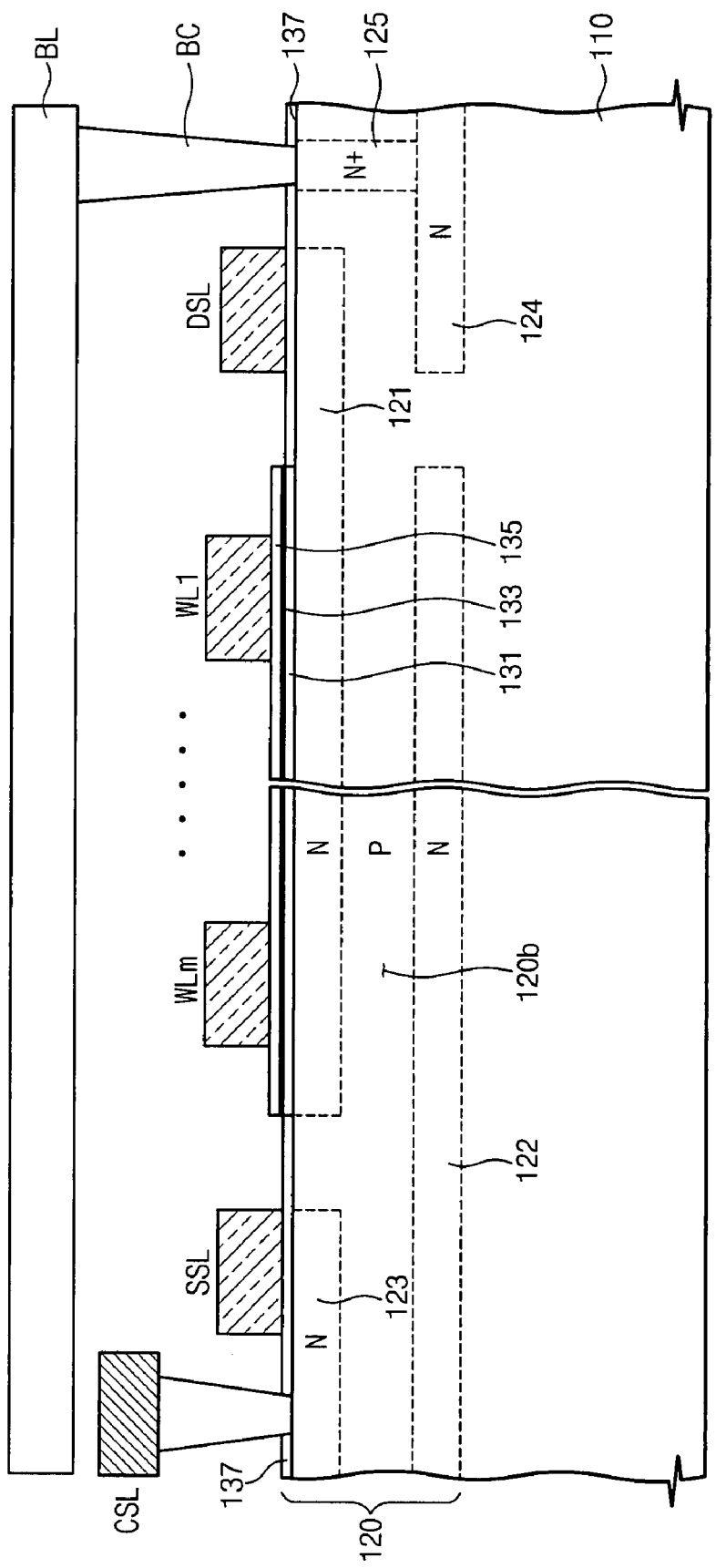

Referring to FIGS. 2A through 2E, modifications of the first embodiment are described below. Only differences between the first embodiment of FIGS. 1A through 1E and the modifications will be mainly described. Referring to FIG. 2A, the first modification is described. The fourth doping layer 124 is spaced apart from the second doping layer 122 under the first doping layer 121, e.g., at the same depth of the second doping layer 122. The first doping layer 121 may partially overlap the second doping layer 122. The third doping layer 123 may partially overlap the second doping layer 122. The fourth doping layer 124 may partially overlap the first doping layer 121. The drain select line DSL may overlap the first doping layer 121 and the fourth doping layer 124. The semiconductor fin 120 on the fourth doping layer 124 may be removed, to expose the fourth doping layer 124, connecting the bit line BL to the fourth doping layer 124. On the other hand, a fifth doping layer 125 of the second conductive type is provided in the upper portion of the semiconductor fin and extends to the fourth doping layer 124. The bit line BL may be connected to the fifth doping layer 125 through the bit line contact BC. The fifth doping layer 125 may have a higher concentration than other doping layers.

The word lines WL1, WL2, . . . , WLm overlap the first doping layer 121 and the second doping layer 122. The source select line SSL overlaps the second doping layer 122 and the third doping layer 123. The drain select line DSL overlaps the first doping layer 121 and the fourth doping layer 124. Therefore, the transistors associated with these lines (WL, SSL, and DSL) are allowed to have vertical channels. Since the memory cells and the select transistors have the vertical channels, the degree of integration in the memory cells can be improved, compared to a typical memory cell. The bit line BL is connected to the fourth doping layer 124 that is a drain region of the first select transistors ST11, ST12, . . . , ST1n through the bit line contact BC. The common source line CSL is connected to the third doping layer 123 that is a source region of the second select transistors ST21, ST22, . . . , ST2n.

Figure 2B:
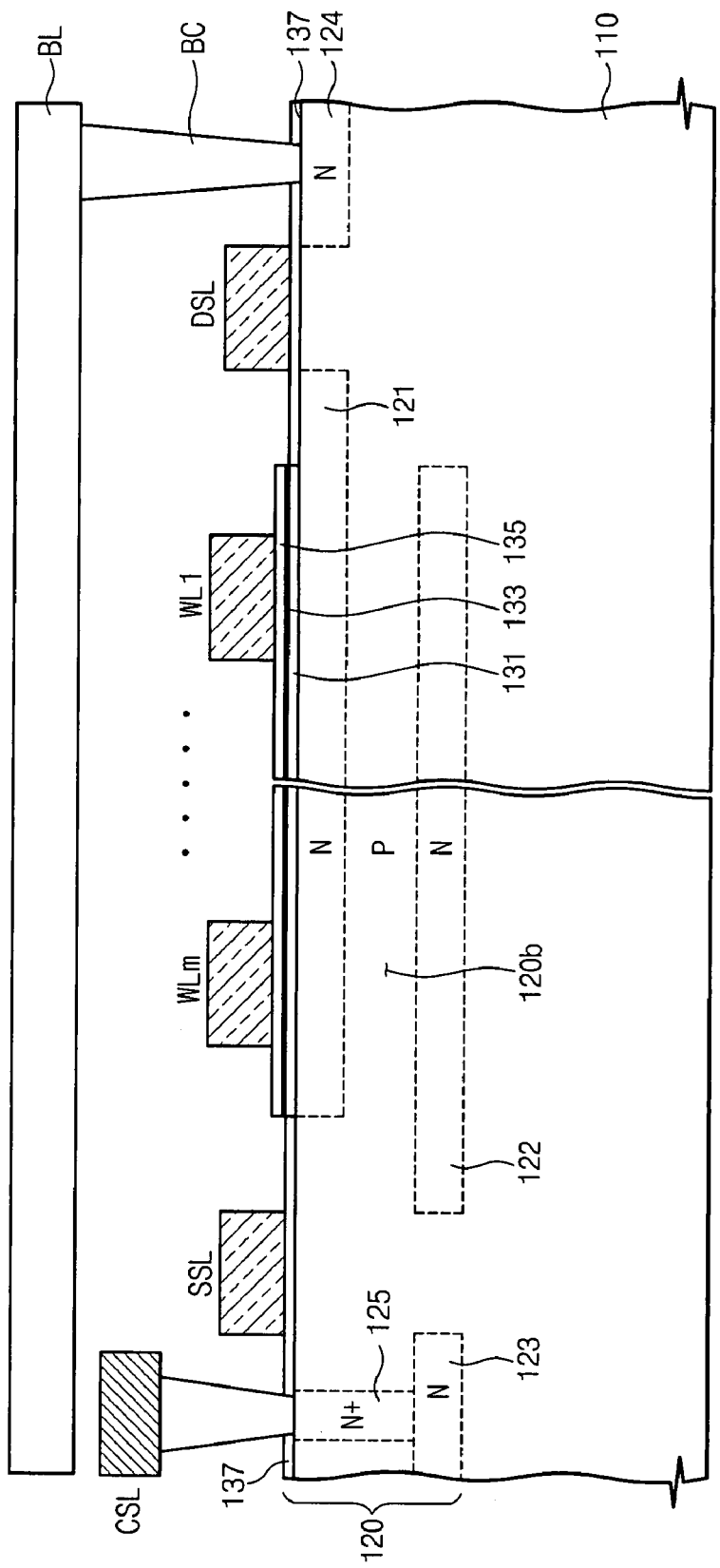

Referring to FIG. 2B, a second modification is described. The third doping layer 123 is spaced apart from the second doping layer 122 under the first doping layer 121, e.g., at the same depth of the second doping layer 122. A fifth doping layer 124 of a second conductive type is additionally provided in the upper portion of the semiconductor fin 120 and extends to the third doping layer 123. The fifth doping layer 125 may have a higher concentration than other doping layers.

The word lines WL1, WL2, . . . , WLm overlap the first doping layer 121 and the second doping layer 122 to allow their transistors to have vertical channels. Since the memory cells have vertical channels, the degree of integration in the memory cells can be improved, compared to a typical memory cell. The source select line SSL may be provided between the second doping layer 122 and the third doping layer 123 to allow its transistor to have a horizontal channel. The drain select line DSL may be provided between the first doping layer 121 and the fourth doping layer 124 to allow its transistor to have a horizontal channel. The bit line BL is connected to the fourth doping layer that is a drain region of the first select transistors ST11, ST12, . . . , ST1n through the bit line contact BC. The common source line CSL is connected to the third doping layer 123 that is a source region of the second select transistors ST21, ST22, . . . , ST2n through the fifth doping layer 125.

Figure 2D:
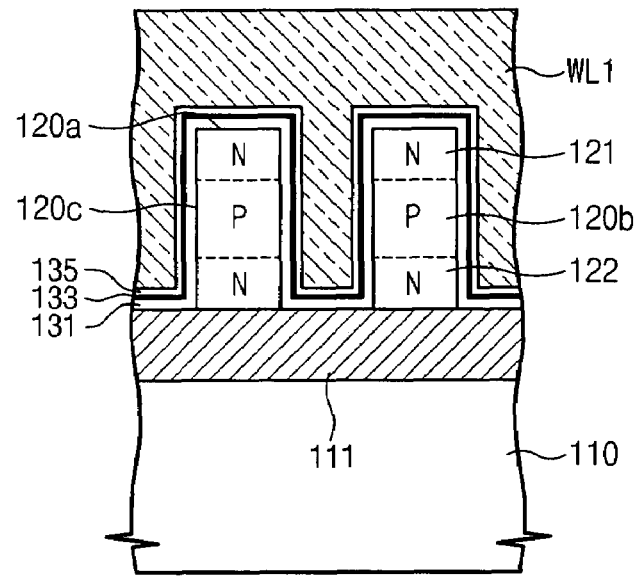
FIGS. 2D and 2E are sectional views taken along line II-II' of FIG. 2B according an embodiment of the present invention.

Referring to FIGS. 2C and 2D, a third modification is described. A buried insulating layer 11 contacting the bottom of the second doping layer 122 may be provided to electrically insulate the semiconductor fins from other semiconductor fins adjacent to the semiconductor fin 120. The fifth doping layer 125 of a second conductive type may be additionally provided. The fifth doping layer 125 is spaced apart from the second doping layer 122 and contacts the top of the buried insulating layer 111. The drain select line DSL is provided between the first doping layer 121 and the fourth doping layer 124 and overlaps the fifth doping layer 125. A terminal BCL applying a bias to the semiconductor substrate 110 is connected to the semiconductor fin 120 spaced apart from the fourth doping layer 124 in the opposite side of the drain select line DSL on the fifth doping layer 125. In this modification, the isolation insulating layer 115 may not be provided in the grooves 113 between the semiconductor fin 120 and other semiconductor fins adjacent to the semiconductor fin 120. The reason is that the buried insulating layer 111 serves as the isolation insulating layer 115. The semiconductor substrate 110 of this embodiment may be a silicon-on-insulator (SOT) substrate having the buried insulating layer 111.

Figure 6A:
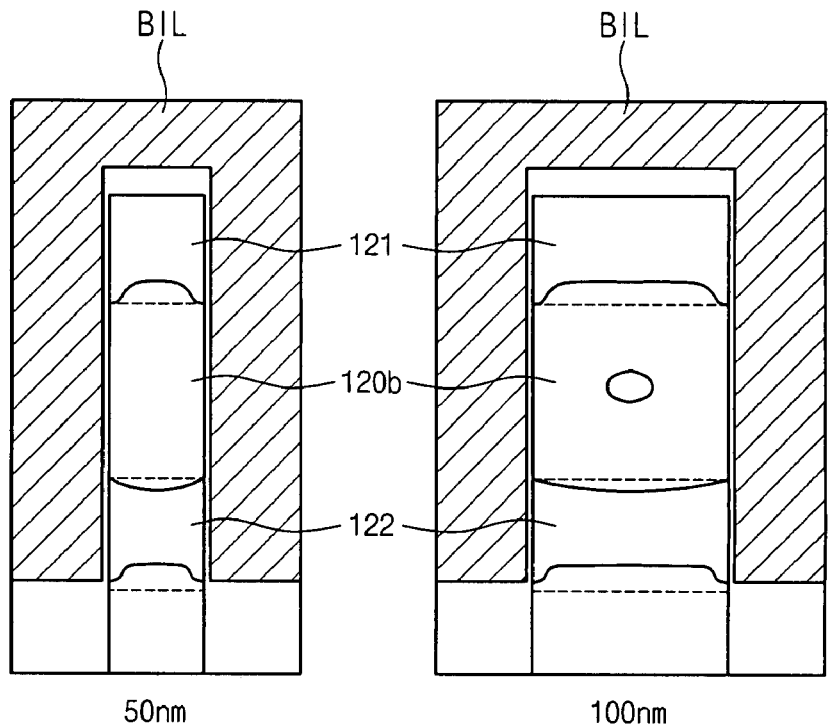
FIGS. 6A and 6B are simulation results illustrating the degree of depletion according to the width of a semiconductor fin, and an electric potential of a self-boosted channel and a threshold voltage change of adjacent cells during a program operation, respectively.
Figure 6B:
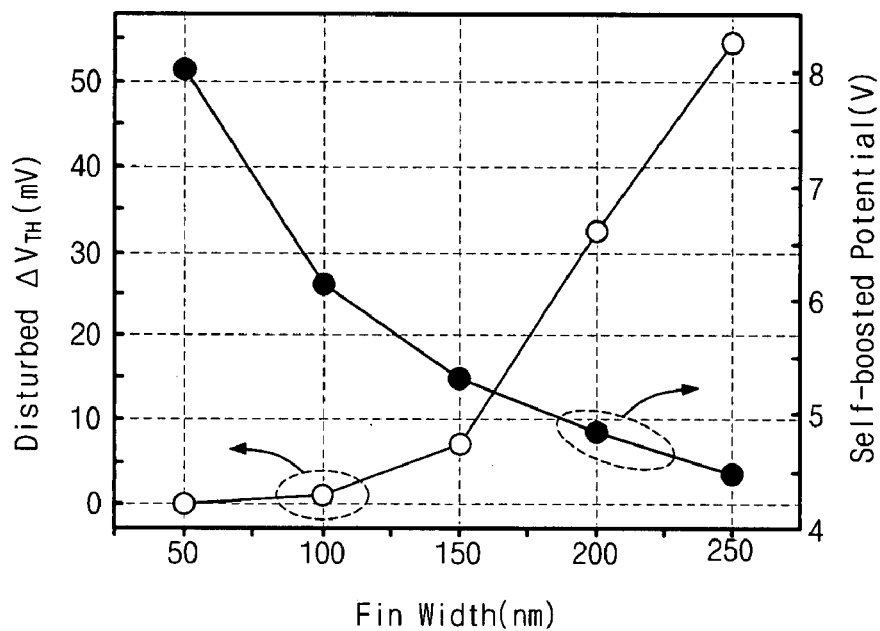

One body contact line BCL can connected to one semiconductor fin, to apply a bias of the semiconductor substrate. The drain select line DSL may allow a body region 120b between the fourth doping layer 124 and the fifth doping layer 125 to be depleted as illustrated in FIGS. 6A and 6B. The body region 120b of the memory cells may float regardless of a bias of the semiconductor substrate. The bias is applied through the body contact line BCL.

The word lines WL1, WL2, . . . , WLm overlap the first doping layer 121 and the second doping layer 122 to allow its transistor to have vertical channel. The source select line SSL overlaps the second doping layer 122 and the third doping layer 123 to allow its transistor to have vertical channel. Since the memory cells have vertical channels, the degree of integration in the memory cells can be improved, compared to a typical memory cell. The drain select line DSL is provided between the first doping layer 121 and the forth doping layer 124 to have a horizontal channel. The bit line BL is connected to the fourth doping layer 124 that is a drain region of the first select transistors ST11, ST12, . . . , ST1n through the bit line contact BC. The common source line CSL is connected to the third doping layer 123 that is a source region of the second select transistors ST21, ST22, . . . , ST2n.

Figure 2E:
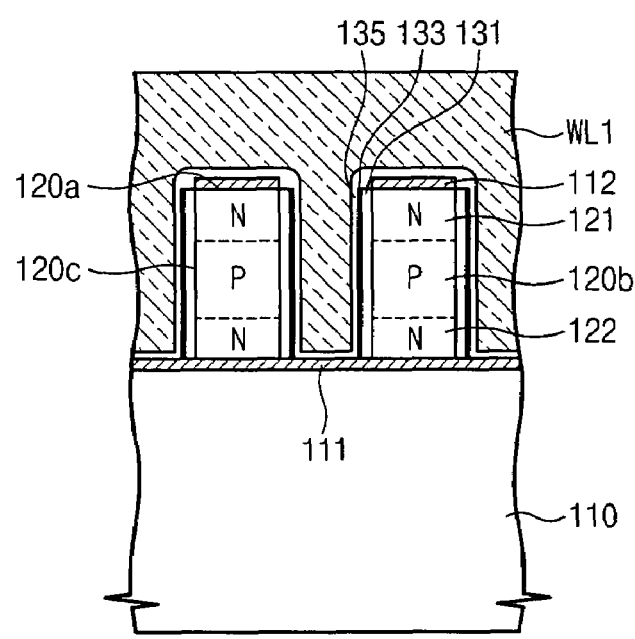

Referring to FIG. 2E, a fourth modification is described. The fourth modification substantially has a structure similar to that of the third modification. The buried insulating layer 111 of this modification may be a silicon oxide layer thinner than that of FIG. 2D. Referring to FIG. 2E, the tunnel insulating layer 131, the charge storage layer 133, and the blocking insulating layer 135 may be provided only on the side surface 120c of the semiconductor fin 120. A silicon oxide layer 112 that substantially has the same thickness as the buried insulating layer 111 may be provided on the top surface 120a of the semiconductor fin 120. Like the third modification, the body region 120b may float regardless of a bias of the semiconductor substrate. Since the memory cells have vertical channels, the degree of integration in the memory cells can be improved, compared to a typical memory cell.

Referring to FIGS. 3A through 3D, the AND flash memory device according to a second embodiment is described. The description identical to that of the first embodiment of FIGS. 1A through 1E will be omitted for conciseness. The AND flash memory device may further include a body isolation line BIL. The body isolation line BIL extends parallel to the word lines WL1, WL2, . . . , WLm and to intersect the direction between the drain select line DSL and the word line WL1 that is the most adjacent to the drain select line DSL. The body isolation line BIL may overlap the first doping layer 121 used as the local bit line LBL and the second doping layer 122 used as the local source line LSL. The body insulting line BIL intersects the direction and extends over the top surface 120a of the semiconductor fin 120, the side surface 120c of the semiconductor fin, and the isolation insulating layer 115.

The body isolation line BIL overlaps the first doping layer 121 and the second doping layer 122 to allow its transistor to have a vertical channel. The body isolation line BIL may allow a body region 120b of the memory cells MC11, MC12, . . . , MCmn to be depleted. Accordingly, the body region 120b of the memory cells may float regardless of a bias of the semiconductor substrate 110.

Referring to FIGS. 6A and 6B, the phenomena that the body region 120b of the vertical transistor on the semiconductor fin 120 is depleted is described. The body region 120b may be a portion between the first doping layer 121 and the second doping layer 122, which are respectively provided to the upper portion and the lower portion of the semiconductor fin 120. FIG. 6A is a result of ATLAS simulation, which illustrates the degree of depletion of the body region 120b, according to the width of the semiconductor fin 120. The voltage Vcc is applied to the body isolation line BIL. FIG. 6B illustrates a disturbed threshold voltage change ΔVth of the unselected memory cell that is the most adjacent to the selected memory cell through a program voltage of the selected memory cell, and an electric potential at the self-boosted channel surface, according to the width of the semiconductor fin. The program voltage applied to a gate of the selected memory cell is about 14 V.

When the width of the semiconductor fin 120 is 50 nm, the body region 120b can be completely depleted by the voltage Vcc applied to the body isolation line BIL as described in FIG. 6A, and the channel surface is easily self-boosted through the program voltage, such that its electric potential increases to about 8.5 V as described in FIG. 6B. Accordingly, the threshold voltage change ΔVth due to disturbance between adjacent memory cells almost does not occur. The body region 120b of the memory cell is completely depleted through a voltage applied to the body isolation line BIL. Accordingly, the body region 120b may float without the influence (refer to an arrow of FIG. 3D) from a ground voltage that is applied to a bias terminal of the semiconductor substrate.

On the contrary, as the width of the semiconductor fin 120 increases, the body region 120b of the memory cell is not completely depleted due to the voltage Vcc applied to the body isolation line BIL. For example, when the width of the semiconductor fin is 100 nm, the middle of the body region 120b is not depleted, as described in FIG. 6A. Accordingly, the body region 120b is under influence of a ground voltage applied to the bias terminal of the semiconductor substrate. The self-boosted electric potential of the channel surface decreases to about 4.5 V, as described in FIG. 6B. The threshold voltage change ΔVth due to the disturbance between adjacent memory cells greatly occurs and is more than about 50 mV.

Briefly, if the width of the semiconductor fin 120 is appropriately adjusted, the body region 120b of the memory cells can float, and can maximize the self-boosting effect to completely remove the disturbance between adjacent memory cells during a program operation. Accordingly, a program operation may be possible by applying a low voltage, e.g., a ground voltage, to the unselected word lines instead of applying a high voltage to the bit line BL. Consequently, a driving circuit may become extremely simple. In the AND flash memory device according to the embodiments of the present invention, the width of the semiconductor fin 120 may range from about 40 nm to about 60 nm to completely deplete the body region 120b of the memory cell. On the other hand, the height of the body region 120b in the semiconductor fin 120 may be as high as a short channel effect does not occur, and be as low as resistance increase does not have an effect on a read operation speed. The height may be about 100 nm.

Referring to FIGS. 4A through 4E, the AND flash memory device according to a third embodiment is described. Unlike the above embodiments, the first doping layer 121 is provided to the lower portion of the semiconductor fin 120 and the second doping layer 122 is provided to the upper portion of the semiconductor fin 120. That is, the local source line LSL is provided to the upper portion of the semiconductor fin 120, and the local bit line LBL is provided to the lower portion of the semiconductor fin 120. The AND flash memory device includes the forth doping layer 124 and the fifth doping layer 125 of a second conductive type, which are spaced from each other on the both sides of the first doping layer 121 in the upper portion of the semiconductor fin 120. The third doping layer 123 of a second conductive type may be spaced apart from the first doping layer 121 under the semiconductor fin 120, i.e., at the same depth as the first doping layer 121. The third doping layer 123 and the fifth doping layer 125 may be connected to each other. The fifth doping layer 125 extends to the third doping layer 123. A sixth doping layer 126 connected to the fourth doping layer 124 is provided in the upper portion of the semiconductor fin 120. The fifth doping layer 125 and the sixth doping layer 126 may have a higher concentration than other doping layers.

The word lines WL1, WL2, ..., WLm overlap the first doping layer 121 and the second doping layer 122. The source select line SSL overlaps the second doping layer 122 and the third doping layer 123. The drain select line DSL overlaps the first doping layer 121 and the fourth doping layer 124. The body isolation line BIL overlaps the first doping layer 121 and the second doping layer 122. Therefore, their transistors can have vertical channels. The body isolation line BIL extends over the top surface 120a and the side surface 120c of the semiconductor fin 120, to intersect the direction, between the source select line SSL and the word line that is the most adjacent to the source select line SSL.

The bit line BL is connected to the sixth doping layer 126 contacting the fourth doping layer 124 that is a drain region of the first select transistors ST11, ST12, ..., ST1n through the bit line contact BC. The common source line CSL is connected to the fifth doping layer 125.

As described in FIGS. 6A and 6B, the body isolation line BIL and the drain select line DSL, allow a body region 120b of the memory cells MC11, MC12, ..., MCmn to be depleted. The body region 120b of the memory cells may float regardless of a bias of the semiconductor substrate 110.

The above embodiments and modifications may be combined to each other for the present invention under operable conditions.

Figure 5A:
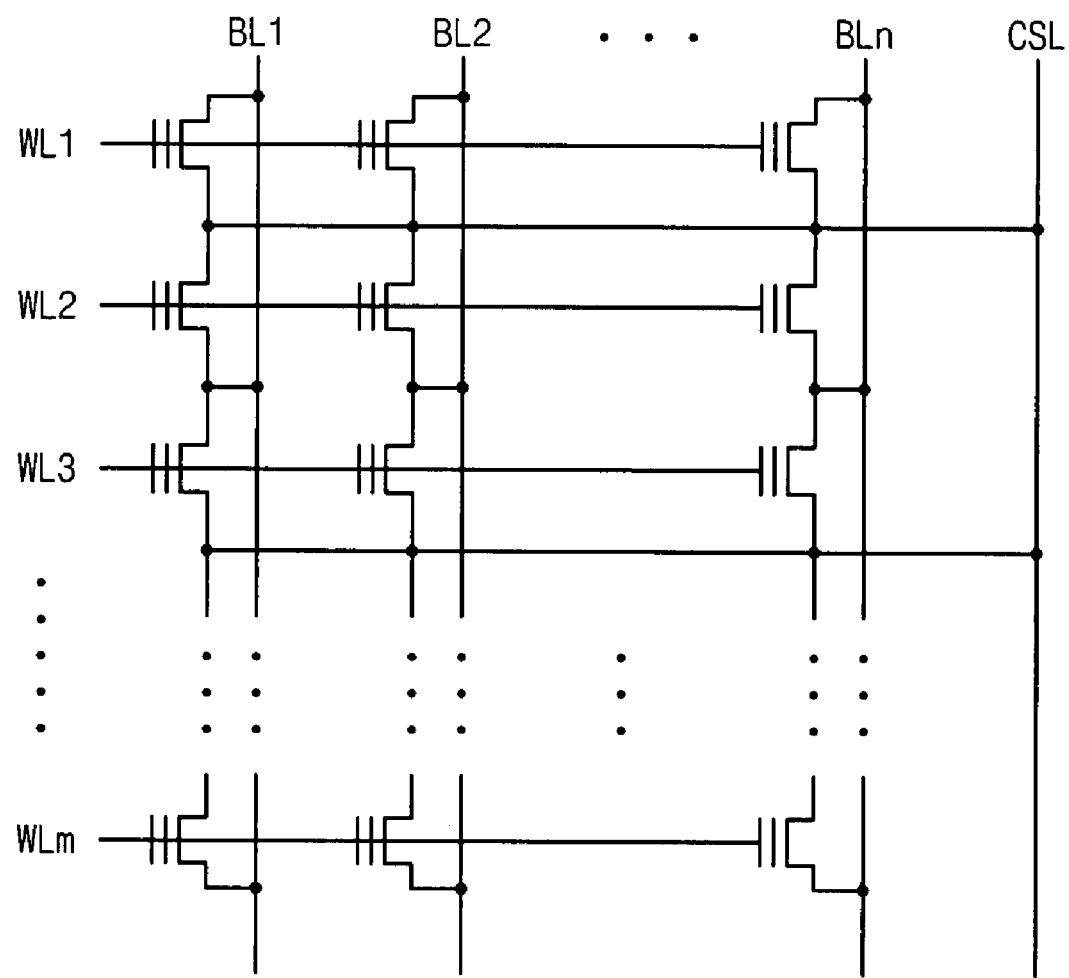
FIGS. 5A and 5B are a circuit diagram and a perspective view, respectively, of a NOR flash memory device according to an embodiment of the present invention.
Figure 5B:
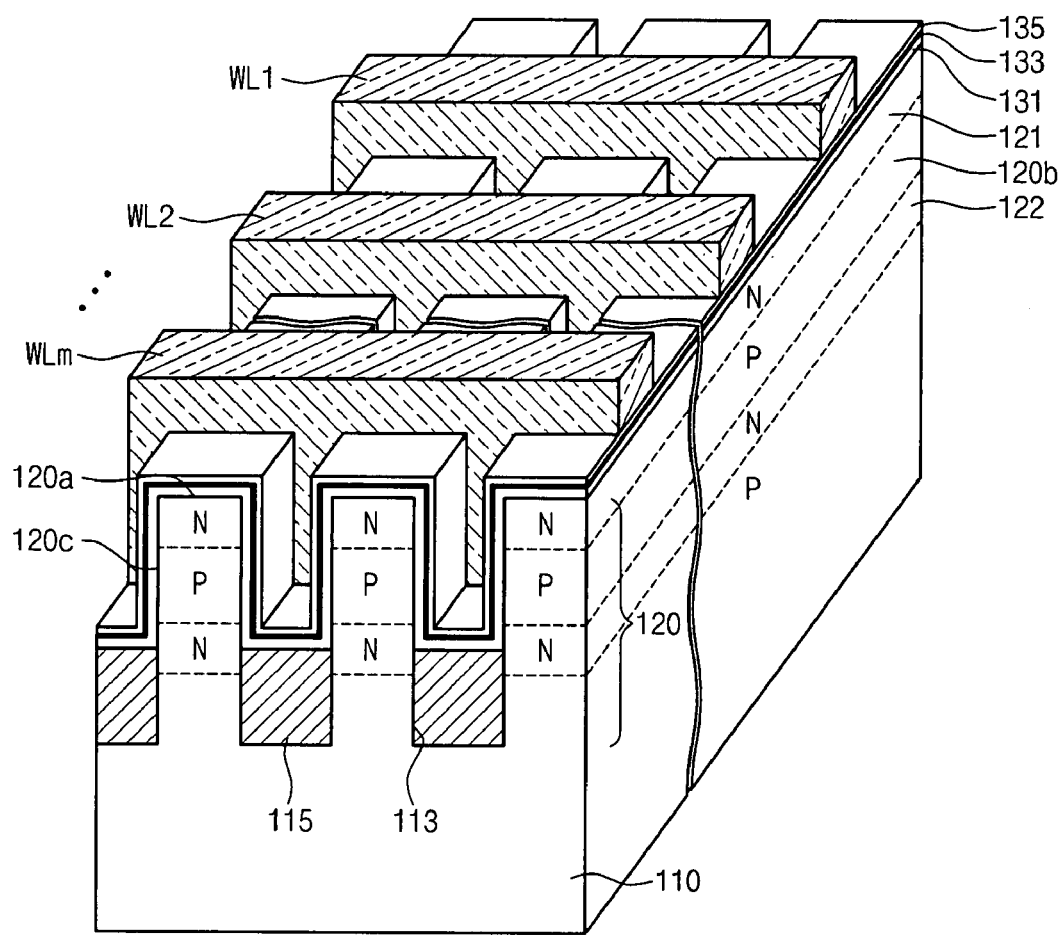

Referring to FIGS. 5A and 5B, according to a fourth embodiment, the flash memory device may be a NOR type. The first doping layer 121 and the second doping layer 122 are the bit line BL and the common source region CSL, respectively, which constitute the NOR flash memory. For a contact for the connection of the second doping layer 122, a third doping layer (not shown) of a second conductive type may be additionally provided. The third doping layer extends from the second doping layer 122 toward the top surface of the semiconductor fin 120, and is spaced apart from the first doping layer 121. The third doping layer may have a higher concentration than other doping layers. An isolation insulating layer 115 may be provided between the lower portion of the semiconductor fin 120 and the lower portions of other semiconductor fins adjacent to the semiconductor fin 120, i.e., at the lower portions of grooves between the semiconductor fin 120 and other semiconductor fins adjacent to the semiconductor fin 120. The isolation insulating layer 115 partially covers the second doping layer 122 to expose the upper side surface of the second doping layer 122. Thus, the second doping layer 122 of the semiconductor fin 120 can be electrically isolated from the second doping layer 122 of other semiconductor fins adjacent to the semiconductor fin 120. One bit line contact for the connection of the bit line BL and one common source contact for the connection of the common source region CSL may be provided on each semiconductor fin 120.

The word lines WL1, WL2, ..., WLm intersect the direction, and extend over the top surface 120a and the side surface 120c of the semiconductor fin 120 and over the isolation insulating layer 115. The word lines WL1, WL2, ..., WLm overlap the first doping layer 121 and the second doping layer 122 to allow their transistors to have vertical channels. Since the memory cells have vertical channels, the degree of integration in the memory cells can be improved, compared to a typical memory cell.

Figure 5C:
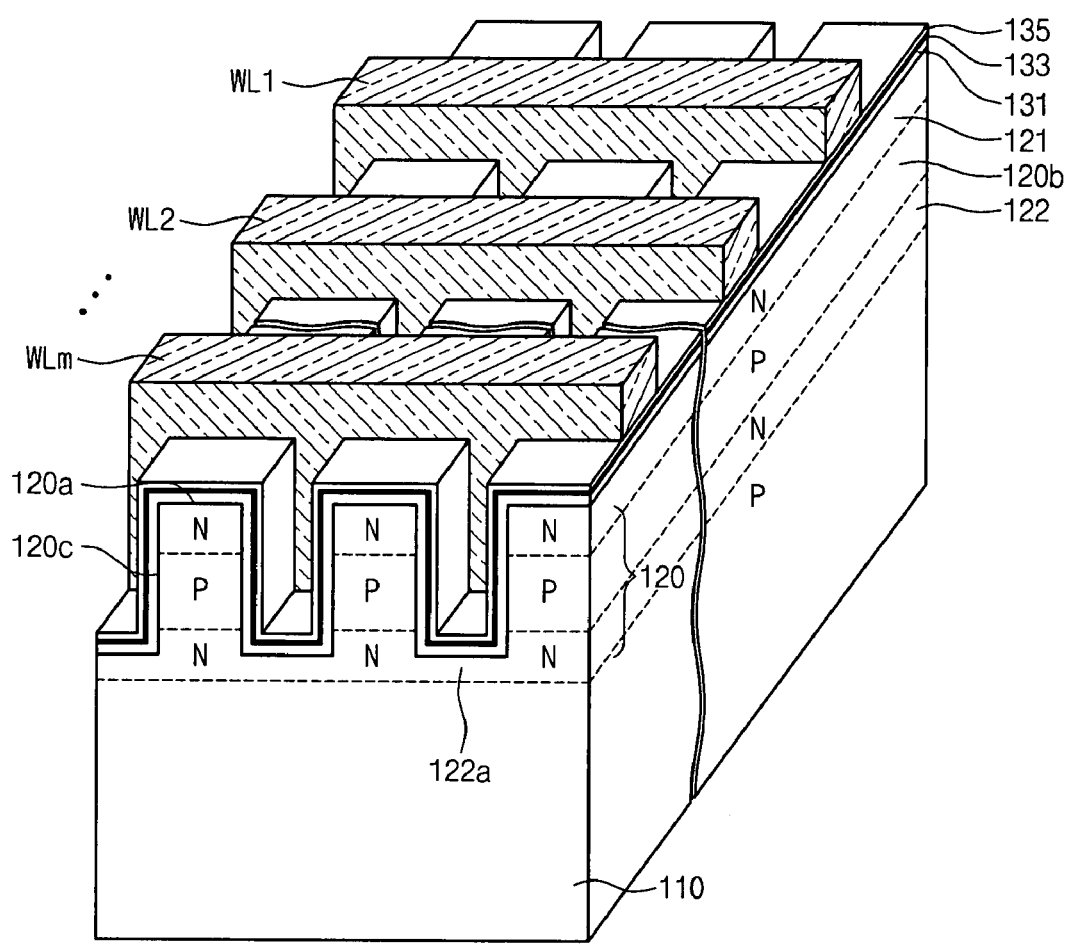
FIG. 5C is a perspective view of a NOR flash memory device according to an embodiment of the present invention.

Referring to FIG. 5C, a modification of the fourth embodiment is described. Only differences between this modification and the fourth embodiment of FIGS. 5A through 5C will be mainly described. Referring to FIG. 5C, the second doping layer 122 of the semiconductor fin 120 and the second doping layer 122 of other semiconductor fins adjacent to the semiconductor fin 120 may be connected to each other. For example, the lower portion 122a of the second doping layer 122 may connect the semiconductor fin 120 with the other semiconductor fins adjacent to the semiconductor fin 120.

The first doping layer 121 and the second doping layer 122 may be the bit line BL and the common source region CSL, respectively, which constitute the NOR flash memory. One bit line contact for the connection of the bit line BL is provided on each semiconductor fin. For a contact for the connection of the second doping layer 122, a third doping layer (not shown) of a second conductive type may be additionally provided. The third doping layer extends from the second doping layer 122 toward the top surface of the semiconductor fin 120, and is spaced apart from the first doping layer 121. The third doping layer may have a higher concentration than other doping layers. Since the one common source region CSL shares a source region of memory cells of the semiconductor fins, a source voltage is applied to one source contact.

A method of fabricating a flash memory device according to the embodiments of the present invention is described below.

Figure 7A:
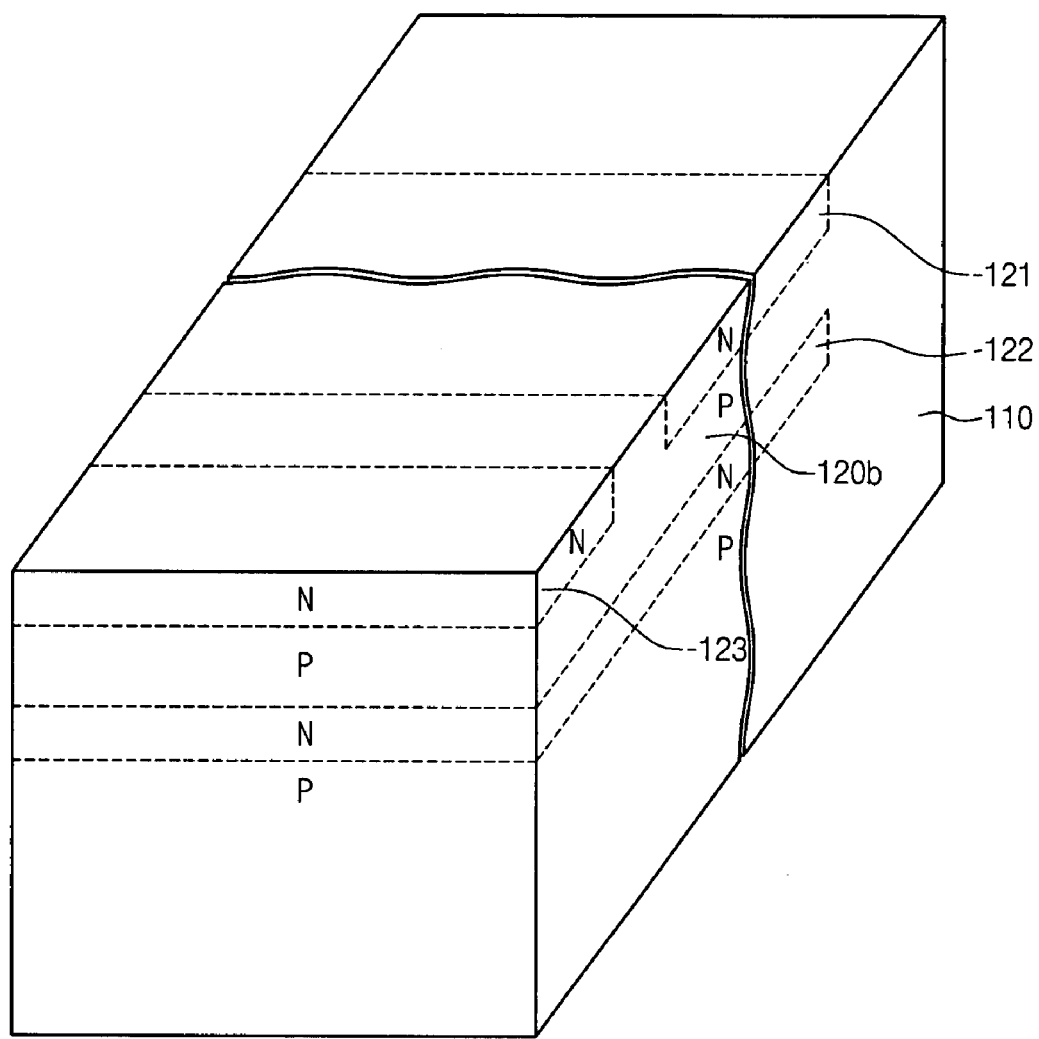
FIGS. 7A through 7F are perspective views illustrating methods of fabricating an AND flash memory device according to an embodiment.

Referring to FIGS. 7A through 7F, a method of fabricating the AND type flash memory device according to the first embodiment of the present invention will be described. Referring to FIG. 7A, the first doping layer 121 and the third doping layer 123 are formed at the upper portion of the semiconductor substrate 110 having a first conductive type, e.g., a p-conductive type. The third doping layer 123 is spaced apart from the first doping layer 121 in one direction. The first doping layer 121 and the third doping layer 123 have a second conductive type, e.g., an n-conductive type.

A second doping layer 122 of the second conductive type is formed at the lower portion of the semiconductor substrate 110, which is vertically spaced from the first doping layer 121 and the third doping layer 123. The first doping layer 121 and the third doping layer 123 may partially overlap the second doping layer 122. To form the first doping layer 121, the second doping layer 122, and the third doping layer 123, the well-known ion implantation process can be performed. The impurity concentration of the ion-implanted doping layers may be adjusted to have a concentration for forming a typical source and drain. The vertically spaced distance may be about 100 nm.

Figure 7B:
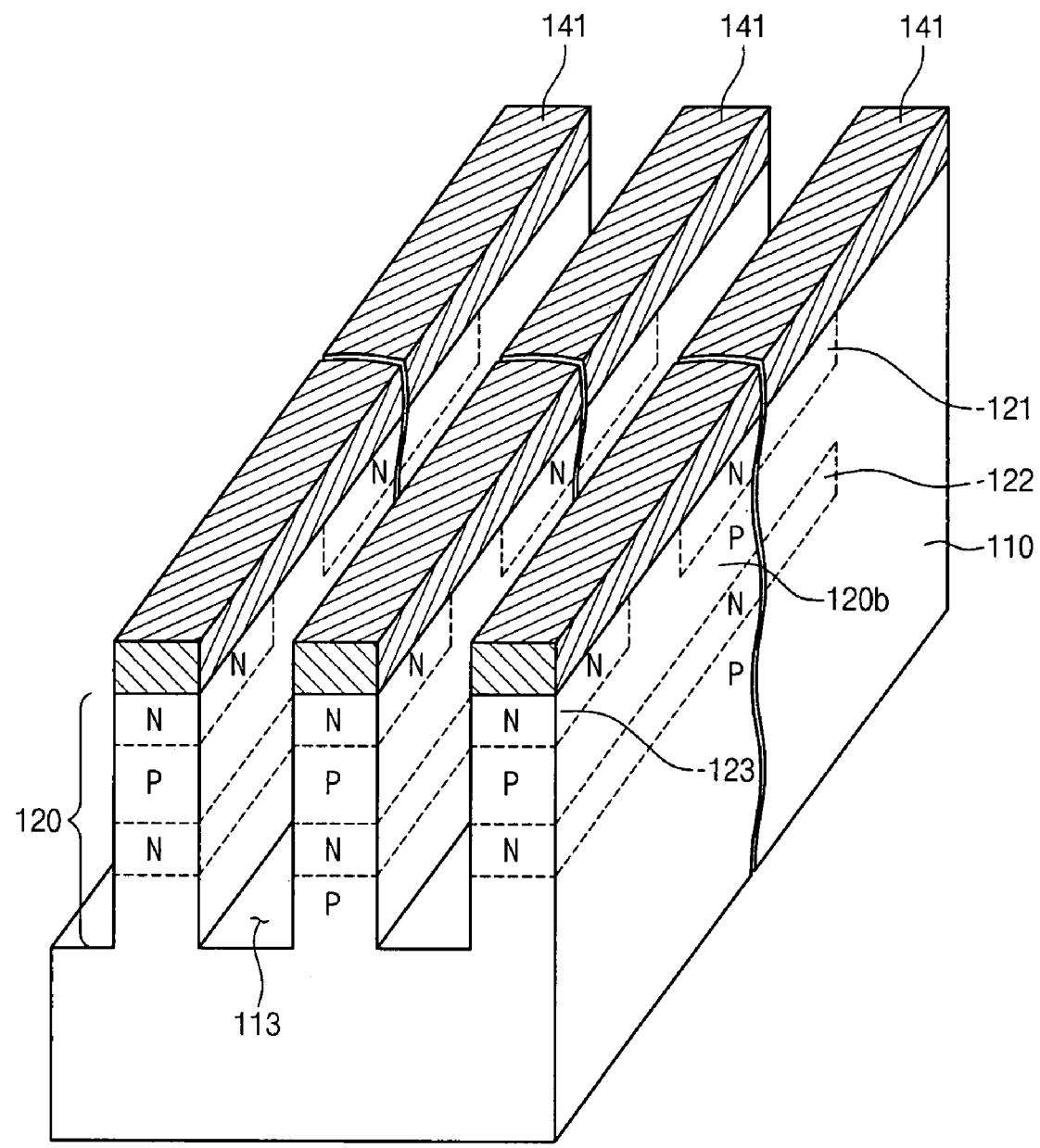

Referring to FIG. 7B, the semiconductor substrate 110 is etched through an etching process by using a first mask pattern 141 extending in one direction. The first mask pattern 141 may be a silicon nitride layer. Grooves 113 having the sides that expose the first doping layer 121 and the second doping layer 122 are formed. A plurality of semiconductor fins 120 are formed between the grooves 113. The grooves 113 expose the first doping layer 121, the second doping layer 122, the third doping layer 123, and the side of the body region 120b. The grooves 113 may have a depth that can separate the second doping layer 122 of the semiconductor fin 120 from the second doping layer 122 of other semiconductor fins adjacent to the semiconductor fin 120.

Figure 7C:
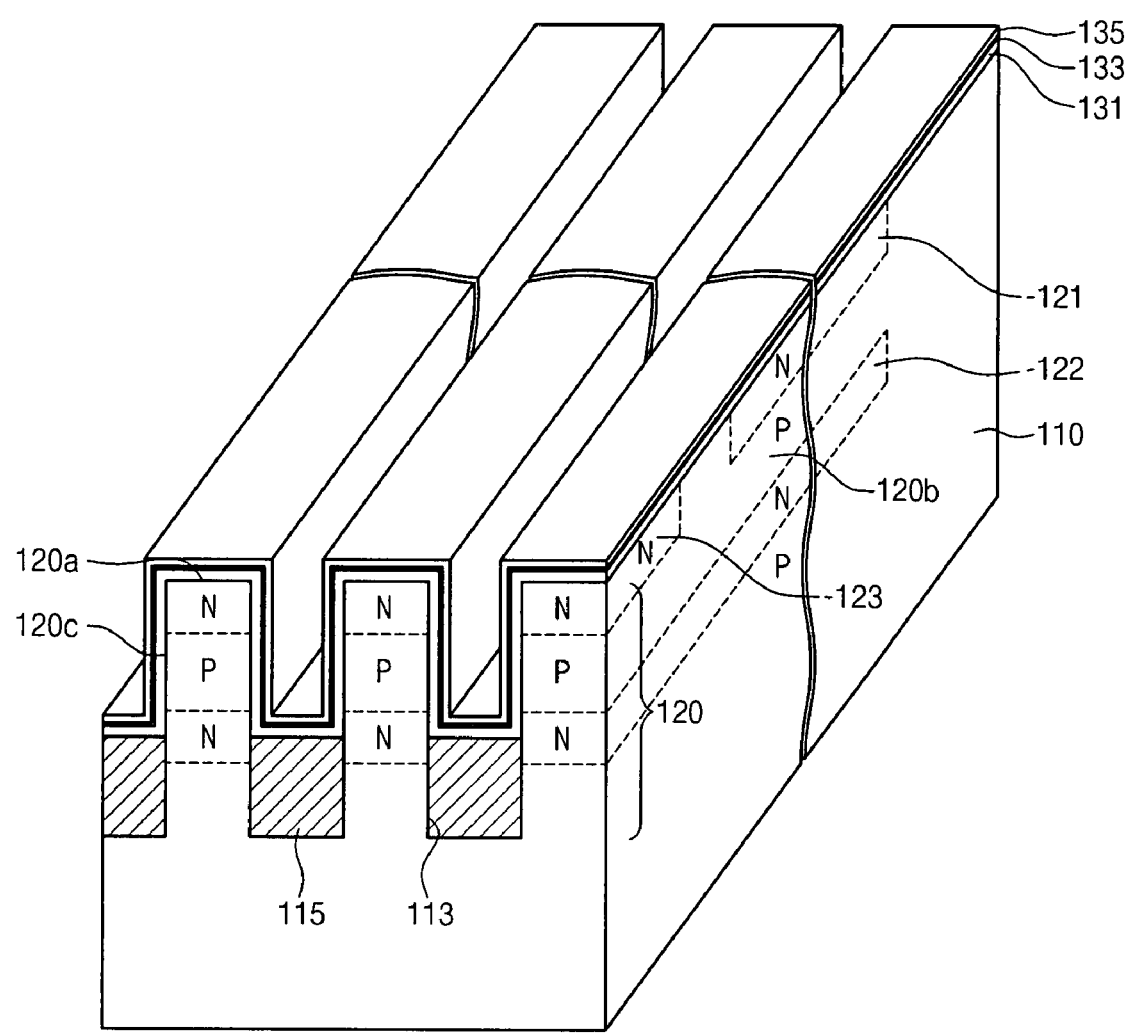

Referring to FIG. 7C, an isolation insulating layer 115 is formed to fill the bottoms of the grooves 113. The isolation insulating layer 115 partially covers the second doping layer 122 to expose its upper side. The forming of the isolation insulating layer 115 may include forming an insulating layer (not shown) to fill the grooves 112 and recessing to expose the upper side of the second doping layer 122. The insulating layer may be a silicon oxide layer. The first mask pattern 141 may be removed.

The tunnel insulating layer 131, the charge storage layer 133, and the blocking insulating layer 135 are sequentially formed to cover the top surface 120a and the side surface 120c of the semiconductor fin 120 and the isolation insulating layer 115. The tunnel insulating layer 131 may be a silicon oxide layer formed by thermally-oxidizing the semiconductor substrate 110. The tunnel insulating layer 131 contacting the isolation insulating layer 115 is described for convenience, and its thickness is insignificant. The charge trap layer 133 may be a dielectric layer having a site to trap charges therein, and may be an insulating layer including a silicon nitride layer, $Al_2O_3$ layer, $HfO_2$ layer, HfAlO layer, and HfSiON layer, and/or a nano dot. The nano dot may include nano crystalline silicon, nano crystalline silicon germanium, and/ or nano crystalline metal. The blocking insulating layer 135 may include a silicon oxide layer, a silicon nitride layer, $Al_2O_3$, hafnium aluminate, HfAlO, HfAlON, hafnium silicate, HfSiO, and/or HfSiON layer.

Figure 7D:
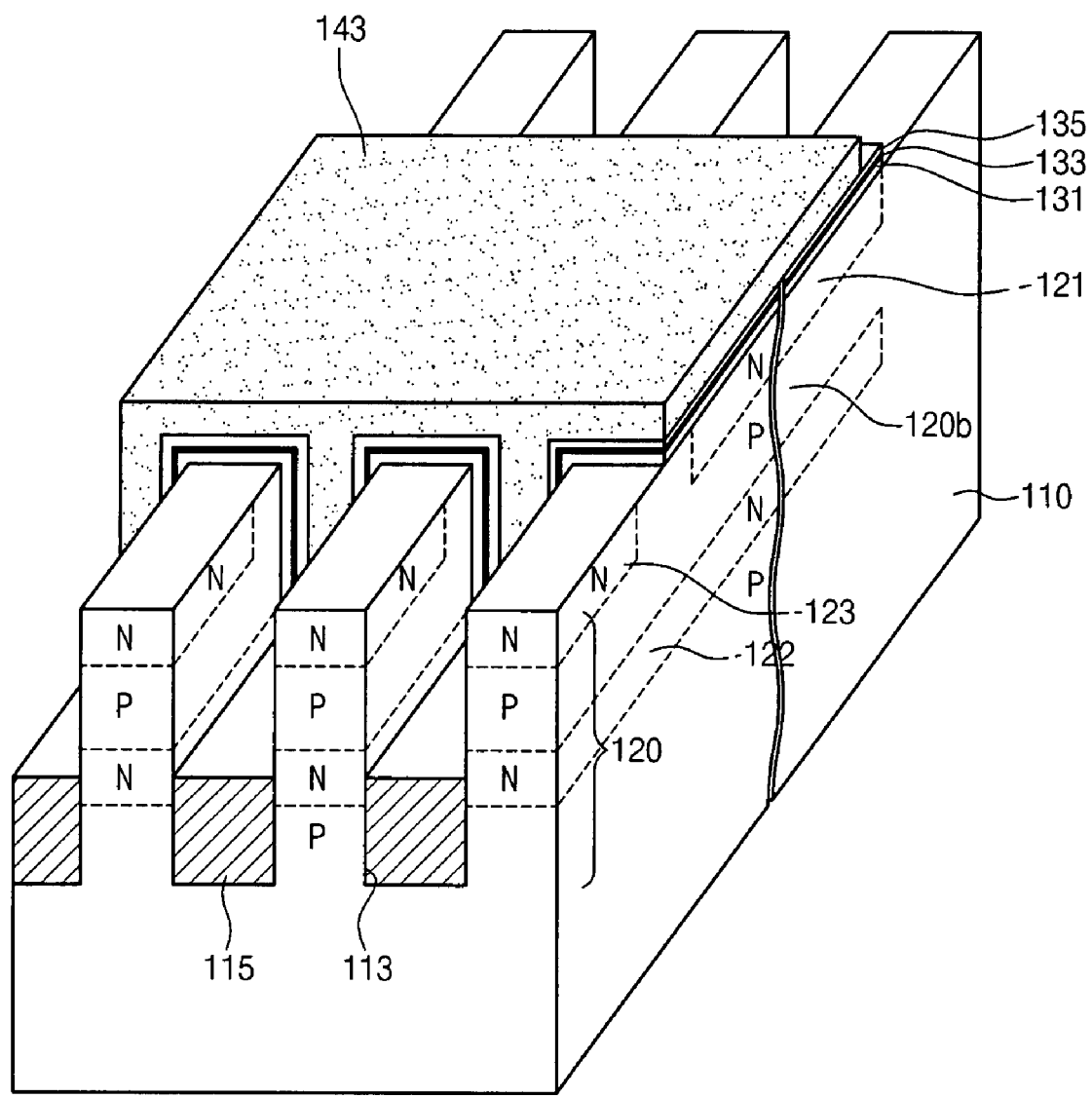

Referring to FIG. 7D, a second mask pattern 143 is formed to cover the tunnel insulating layer 131, the charge storage layer 133, and the blocking insulating layer 135 on the first doping layer 121. The second mask pattern 143 may be a photoresist pattern. Through an etching process that uses the mask pattern, the tunnel insulating layer 131, the charge storage layer 133, and the blocking insulating layer 135 may remain only on the first doping layer 121. The top surface 120a and the side surface 120c of the semiconductor fin 120 outside the first doping layer 121 may be exposed.

Figure 7E:
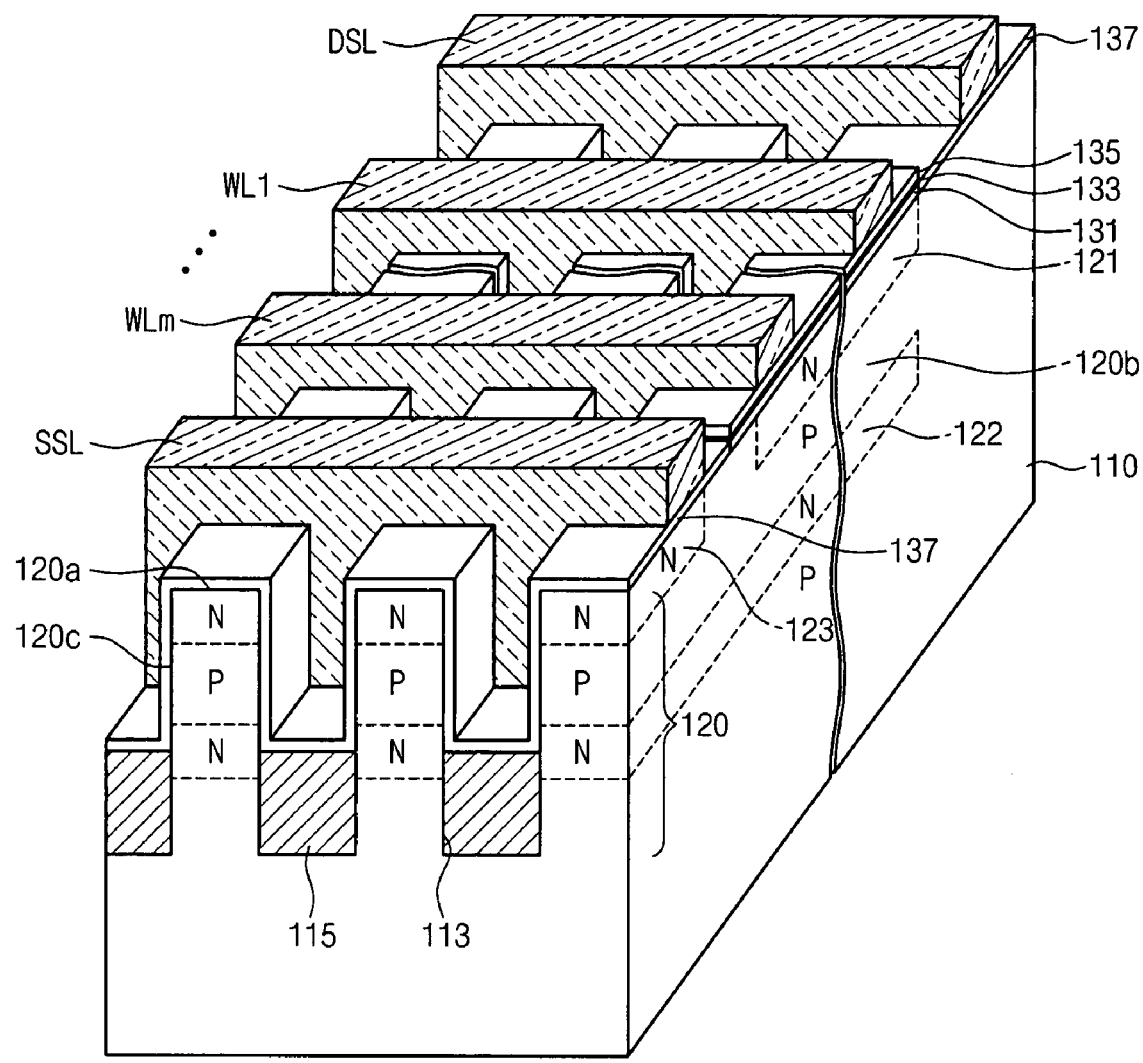

Referring to FIG. 7E, the second mask pattern 143 is removed. A gate insulating layer 137 is formed on the top surface 120a and the side surface 120c of the exposed semiconductor fin 120. The gate insulating layer 137 is a silicon oxide layer formed by thermally-oxidizing the semiconductor substrate 110. A gate layer (not shown) is formed to fill the grooves 113 on the blocking insulating layer 135 and the gate insulating layer 137. The gate layer may be a polysilicon layer, a metal layer or a staked layer thereof.

The gate layer is patterned. A plurality of word lines WL1, WL2, ..., WLm overlapping the first doping layer 121 and the second doping layer 121, a source select line SSL overlapping the second doping layer 122 and the third doping layer 123, and the drain select line DSL spaced apart from the first doping layer 121 and the second doping layer 122 are formed. The word lines WL1, WL2, ..., WLm, the drain select line DSL, and the source select line SSL intersect the direction, and extend over the top surface 120a and the side surface 120c of the semiconductor fin 120 and over the isolation insulating layer 115. The tunnel insulating layer 131, the charge storage layer 133, and the blocking insulating layer 135 may be interposed between the word lines WL1, WL2, ..., WLm and the semiconductor fin 120. A gate insulating layer 137 may be interposed between the drain select line DSL and the semiconductor fin 120, the source select line SSL and the semiconductor fin 120.

Figure 7F:
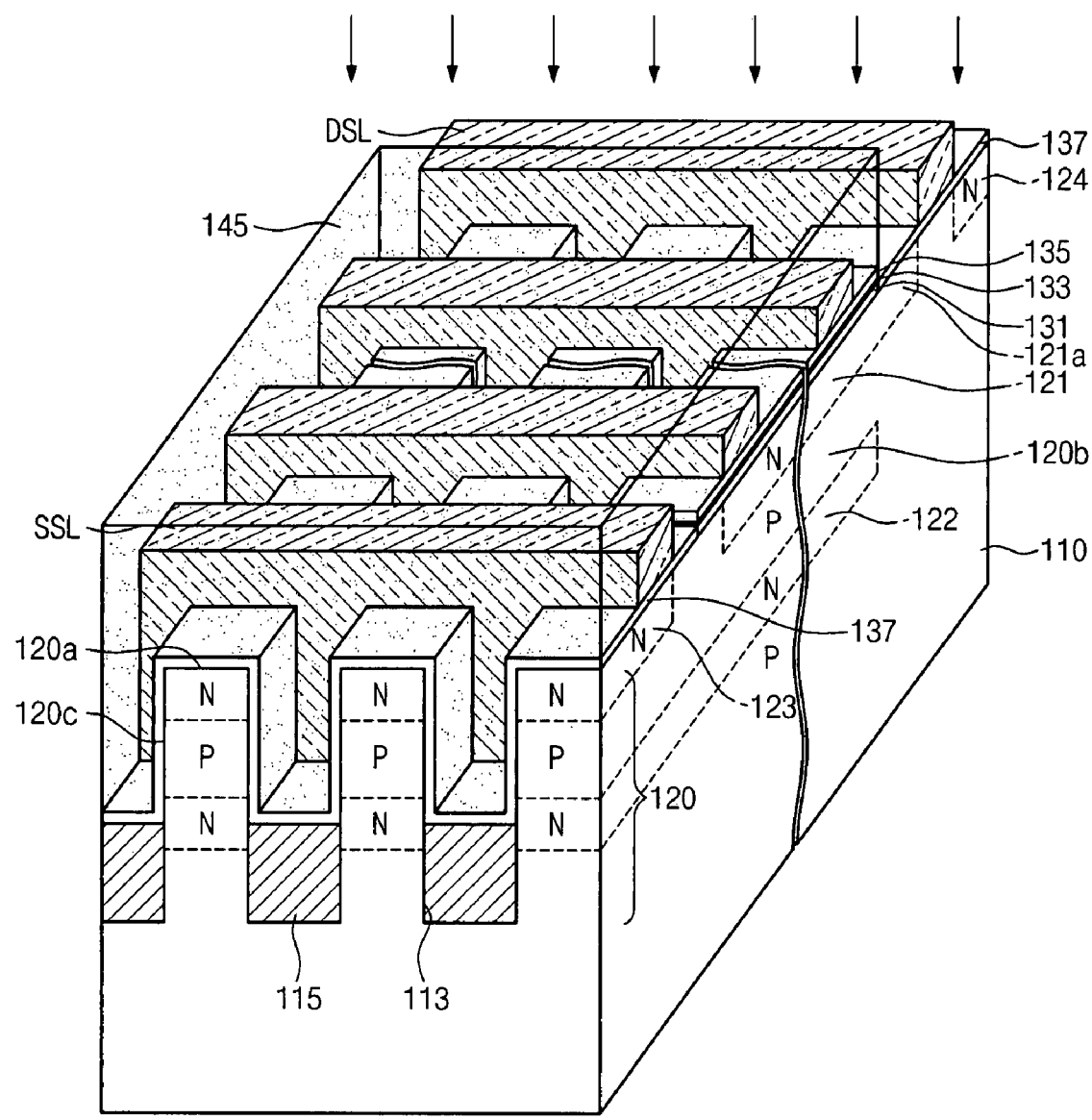

Referring to FIG. 7F, a third mask pattern 145 is formed to cover the source select line SSL and the word lines WL1, WL2, ..., WLm and expose the drain select line DSL and the semiconductor fin 120 adjacent to the drain select line DSL. Through an ion implantation process using the third mask pattern 145, an extended region 121a of the first doping layer and the fourth doping layer 124 are formed in the semiconductor fin 120 on both sides of the drain select line DSL. The extended region 121a of the first doping layer and the fourth doping layer 124 may have a second conductive type. The extended region 121a of the first doping layer is a region where the first doping layer 121 extends toward the drain select line DSL. The extended region 121a of the first doping layer and the fourth doping layer 124 are self-aligned to the drain select line DSL. The extended region 121a of the first doping layer is formed on the side of the first doping layer 121, and the fourth doping layer 124 may be formed on the side opposite to the first doping layer 121.

Referring to FIGS. 1C and 1E again, a first interlayer insulating layer (not shown) is formed on the semiconductor substrate 110. An opening exposing the third doping layer 123 is formed by etching the first interlayer insulating layer. A common source line CSL of a conductive pattern is formed in the opening. A second interlayer insulating layer (not shown) is formed on the first interlayer insulating layer. The first and second interlayer insulating layers may be a silicon oxide layer, for example a boro-phospho-silicate glass (BPSG) layer. An opening exposing the fourth doping layer 124 can be formed by etching the first and second insulating layers. A bit line contact BC is formed in the opening, and a bit line BL connected to the bit line contact BC is formed on the second interlayer insulating layer.

Figure 8A:
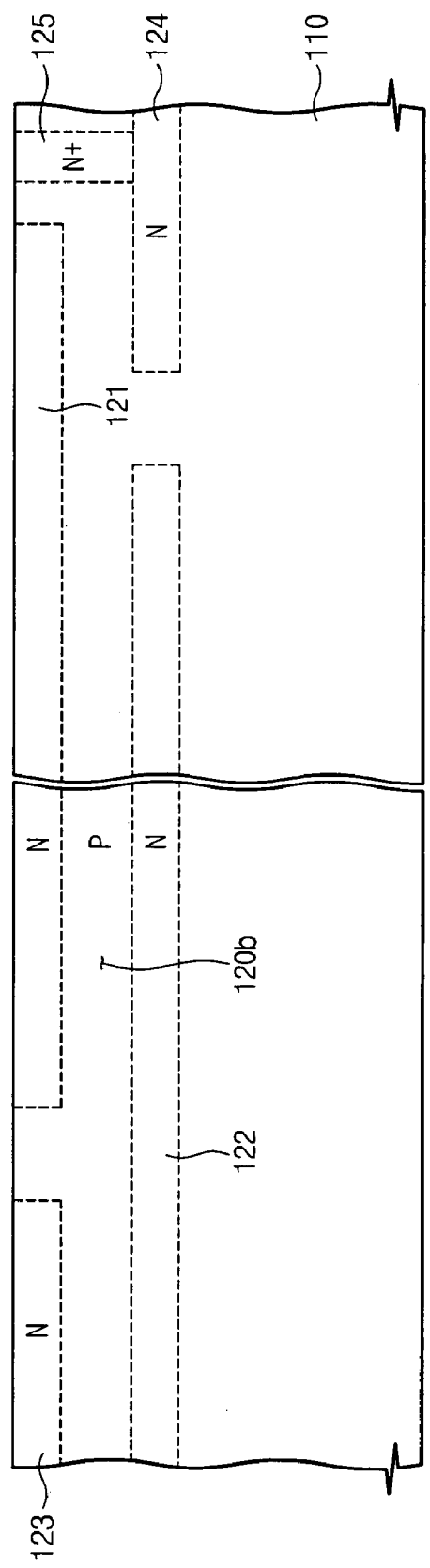
FIGS. 8A and 8B are sectional views taken along line II-II' of FIG. 11B and illustrating methods of fabricating an AND flash memory device according to an embodiment.
Figure 8B:
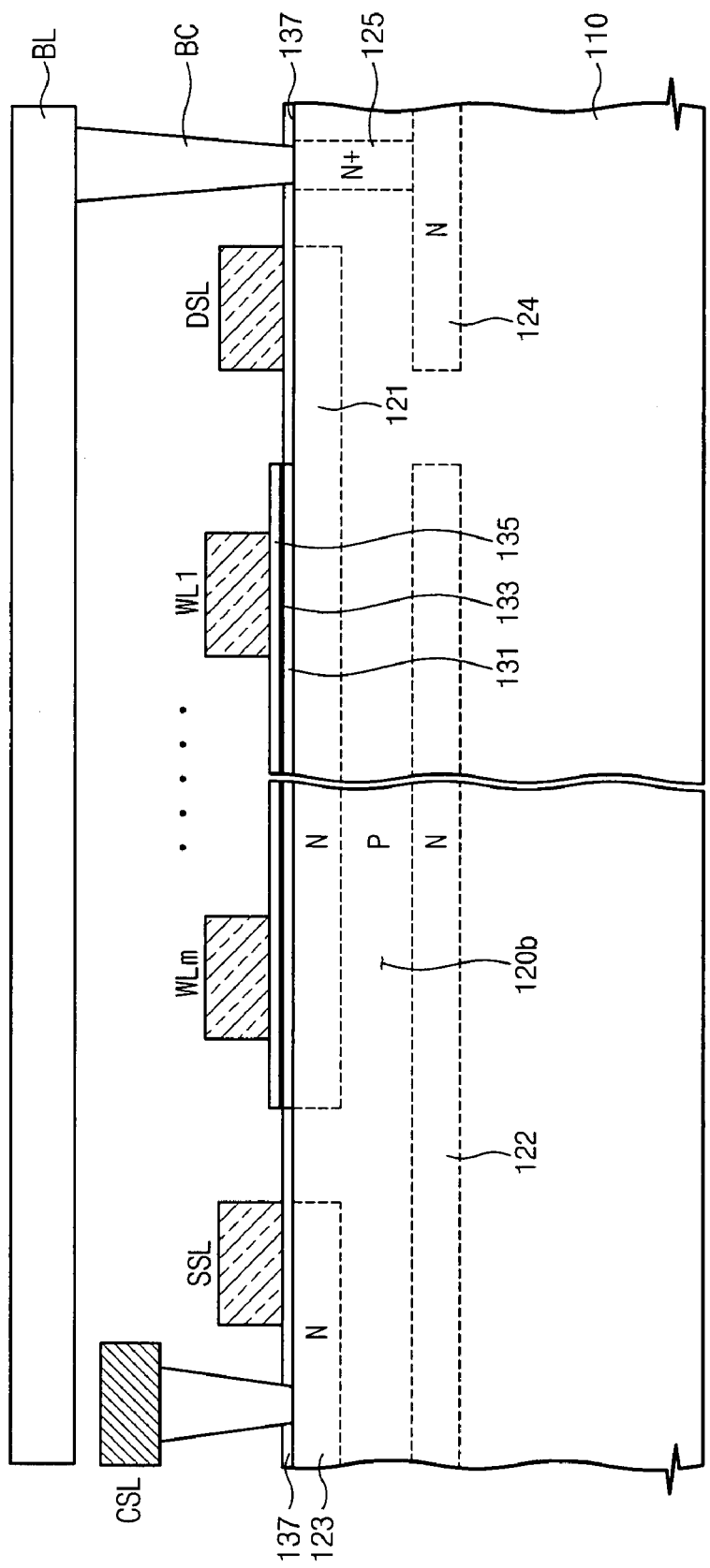

Referring to FIGS. 8A and 8B, a method of fabricating the AND flash memory device according to the first modification of the first embodiment is described. Only difference between the method of the first modification and the method of FIGS. 7A through 7F will be mainly described. Similar to the description of FIG. 7A, a first doping layer 121 and a third doping layer 123 are formed at the upper portion of a semiconductor substrate 110 having a first conductive type, e.g., a p-conductive type. The third doping layer 123 is spaced apart from the first doping layer 121 in one direction. The first doping layer 121 and the third doping layer 123 have a second conductive type, e.g., an n-conductive type.

A second doping layer 122 and a fourth doping layer 124 of the second conductive type are formed in a lower portion of the semiconductor substrate 110 that is vertically spaced apart from the first doping layer 121 and the third doping layer 123. The second doping layer 122 and the fourth doping layer 124 may be formed with the almost same depth. The second doping layer 122 and the fourth doping layer 124 are spaced apart from each other. The first doping layer 121 and the third doping layer 123 may partially overlap the second doping layer 122. The first doping layer 121 may partially overlap the fourth doping layer 124. A fifth doping layer 125 is formed in the semiconductor fin 120 spaced apart from the first doping layer 121 in the direction. The fifth doping layer 125 is the second conductive type and may have a higher concentration than other doping layers. The fifth doping layer 125 extends to the fourth doping layer 124, and may serve as a contact that connects the fourth doping layer 124 with the external line.

Referring to FIG. 8B, like the method of FIGS. 7B through 7E, a semiconductor fin 120, the word lines WL1, WL, ..., WLm, the drain select line DSL, the source select line SSL, the common source line CSL, the bit line contact BC, and the bit line BL may be formed. Like the method of 7F, the extended region 121a and the forth doped layer 124 may be formed at both sides of the drain select line DSL.

Figure 9A:
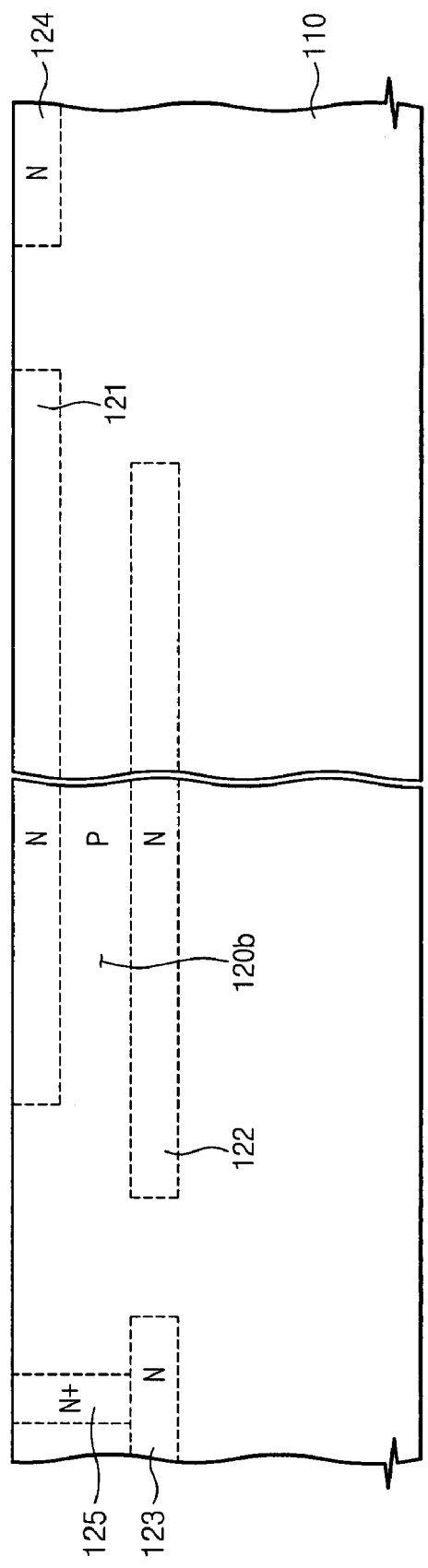
FIGS. 9A and 9B are sectional views taken along line II-II' of FIG. 1B and illustrating methods of fabricating an AND flash memory device according to an embodiment.
Figure 9B:
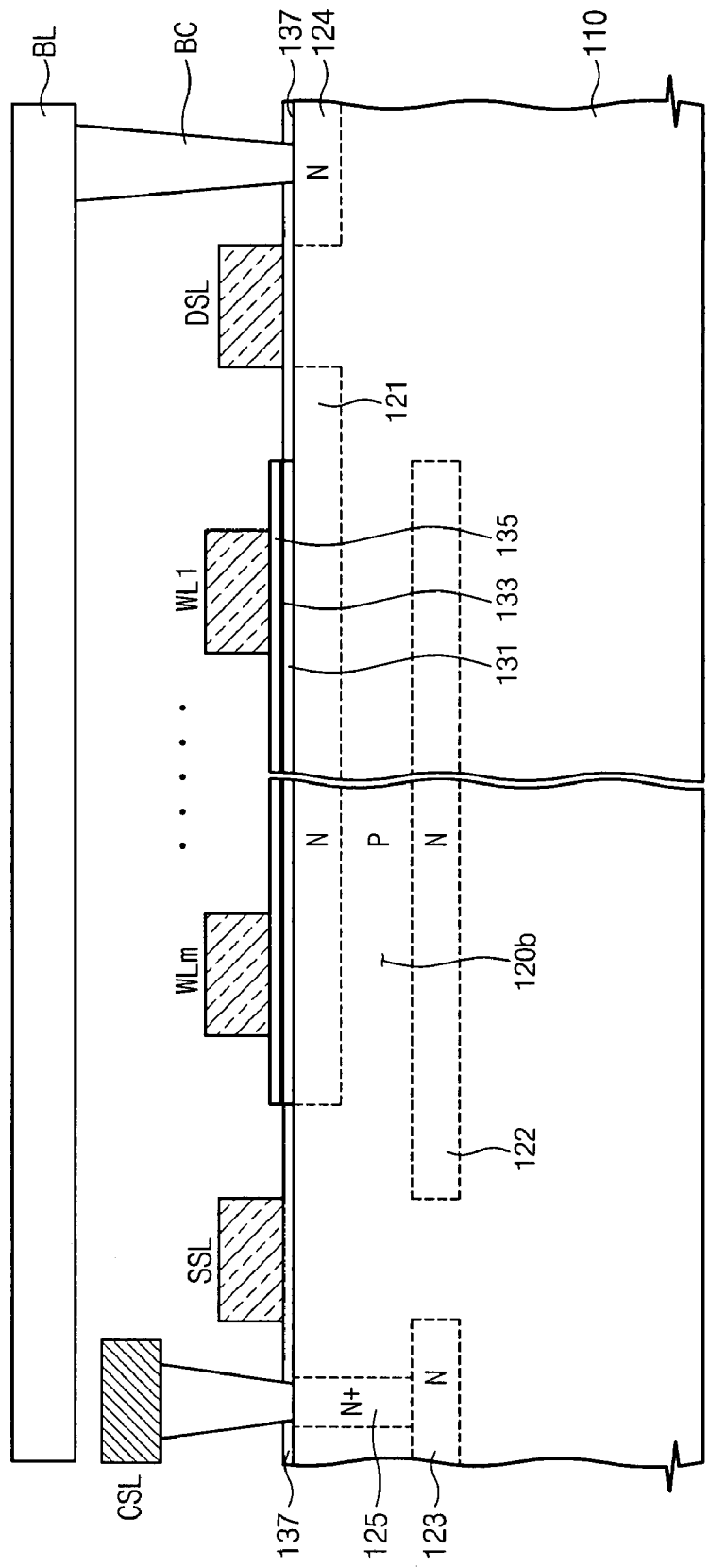

Referring to FIGS. 9A and 9B, a method of fabricating the AND flash memory device according to a second modification of the first embodiment is described. Only difference between this method and the method referring to FIGS. 7A through 7F will be mainly described. Referring to FIG. 9A, a first doping layer 121 having the second conductive type, e.g., an n-conductive type is formed at the upper portion of a semiconductor substrate 110 having a first conductive type, e.g., a p-conductive type.

A second doping layer 122 and a third doping layer 123 are formed at the lower portion of the semiconductor substrate 110 that is vertically spaced apart from the first doping layer 121. The second and third doping layers 122 and 123 may be formed at the almost same depth. The first doping layer 121 may partially overlap the second doping layer 122. A fifth doping layer 125 is formed at the upper portion of the semiconductor fin 120 spaced apart from the first doping layer 121 in the direction. The fifth doping layer 125 is the second conductive type, and may have a higher concentration than other layers. The fifth doping layer 125 extends to the third doping layer 123, and may serve as a contact that connects the third doping layer 123 with an external line.

Referring to FIG. 9B, like the method of FIGS. 7B through 7E, the semiconductor fin 120, the word lines WL1, WL2, ..., WLm, the drain select line DSL, the source select line SSL, the common source line CSL, the bit line contact BC, and the bit line BL can be formed. Like the method of 7F, the extended region 121a and the forth doped layer 124 may be formed at both sides of the drain select line DSL.

Figure 10A:
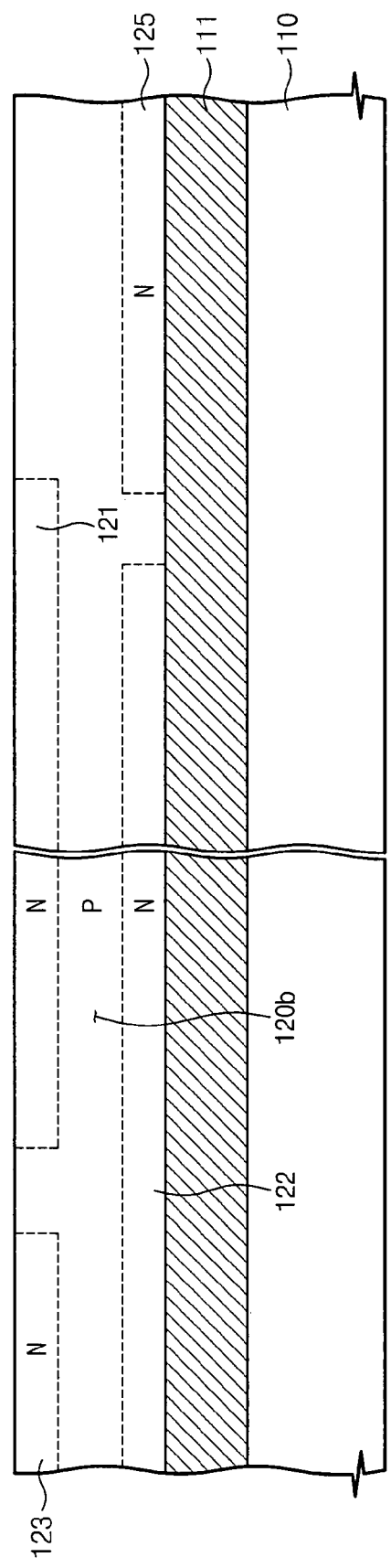
FIGS. 10A and 10B are sectional views taken along line II-II' of FIG. 1B and illustrating methods of fabricating an AND flash memory device according to an embodiment.
Figure 10B:
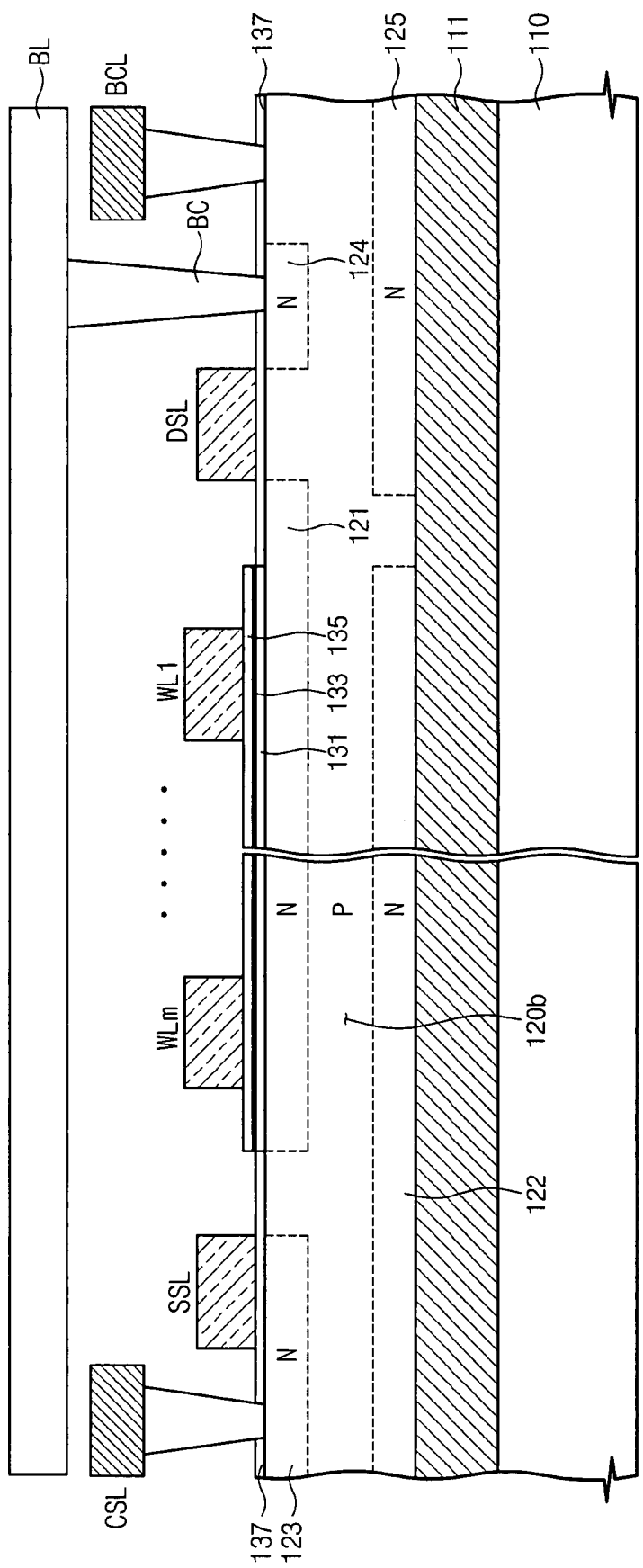

Referring to FIGS. 10A and 10B, a method of fabricating the AND flash memory device 100 according to the third modification of the first embodiment is described. Only difference between the method of the third modification and the method of FIGS. 7A through 7F will be mainly described. Referring to FIG. 10A, the semiconductor substrate 110 may be a SOI substrate having a buried insulating layer 111. A first doping layer 121 and a third doping layer 123 are formed at the upper portion of the semiconductor substrate 110. The third doping layer 123 is spaced apart from the first doping layer 121 in one direction. The first doping layer 121 and the third doping layer 123 have the second conductive type, e.g., an n-conductive type.

A second doping layer 122 and a fifth doping layer 125 of the second conductive type are formed at the lower portion of the semiconductor substrate 110 that is vertically spaced apart from the first doping layer 121 and the third doping layer 123, to contact the top surface of the buried insulating layer 111. The second doping layer 122 and the fifth doping layer 125 may be spaced apart in the direction. The first doping layer 121 and the third doping layer 123 may partially overlap the second doping layer 122. The first doping layer 121 may partially overlap the fifth doping layer 125.

Referring to FIG. 10B, like the method of FIGS. 7B through 7e, the semiconductor fin 120, the word lines WL1, WL, ..., WLm, the drain select line DSL, and the source select line SSL may be formed. Like the method of 7F, the extended region 121a and the forth doped layer 124 may be formed at both sides of the drain select line DSL.

Referring to FIG. 2C again, a first interlayer insulating layer (not shown) covering the semiconductor substrate 110 is formed. A first opening (not shown) exposing the third doping layer 123 is formed by etching the first interlayer insulating layer. Simultaneously, a second opening (not shown) that exposes the semiconductor fin 120 adjacent to the fourth doping layer 124 may be formed. A common source line CSL and a body contact line BCL having respective conductive patterns are formed in the first and second openings. A second interlayer insulating layer (not shown) is formed on the first interlayer insulating layer. The first and second interlayer insulating layers may be a silicon oxide layer, for example BPSG layer. The first and second interlayer insulating layers are etched to form an opening that exposes the fourth doping layer 124. A bit line contact BC is formed in the opening, and a bit line BL connected to the bit line contact BC is formed on the second interlayer insulating layer.

Figure 11A:
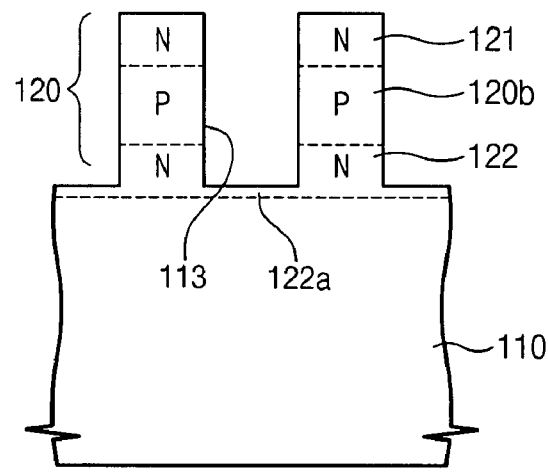
FIGS. 11A and 11B are sectional views taken along line II-II' of FIG. 1B and illustrating a method of fabricating an AND flash memory device according to an embodiment of the present invention.
Figure 11B:
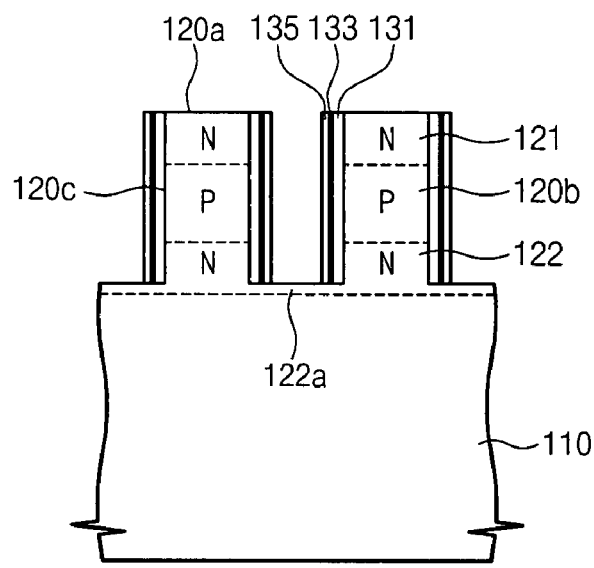

Referring FIGS. 11A, 11B, and 2E, a method of fabricating the AND flash memory device according to the forth modification of the first embodiment is described. Only difference between the method of the third modification and the method referring to FIG. 10A and 10B will be mainly described. Referring to FIG. 11A, the semiconductor substrate 110 of FIG. 7A is etched. Grooves 113 having the side that exposes the first doping layer 121 and the second doping layer 122 are formed. A plurality of semiconductor fins 120 having the first doping layer 121, the second doping layer 122, the third doping layer, the body region 120b therebetween are formed between the grooves 113. The grooves 113 may be formed such that a lower portion 122a of the second doping layer remains.

Referring to FIG. 11B, a tunnel insulating layer 131, a charge storage layer 133, and a blocking insulating layer 135 are sequentially formed to cover the top surface 120a and the side surface 120c of the semiconductor fin 120 and the lower portion 122a of the second doping layer. The tunnel insulating layer 131, the charge storage layer 133, and the blocking insulating layer 135 on the top surface 120a and the lower portion 122a are removed. The removing process may be performed through anisotropic etching. The tunnel insulating layer 131, the charge storage layer 133, and the blocking insulating layer 135 only remain on and cover the side surface 120c of the semiconductor fin 120.

Referring to FIG. 2E again, through a thermal oxide process, the remaining portion 122a of the second doping layer 122 is oxidized, such that a buried insulating layer 111 is formed between the second doping layer 122 and the semiconductor substrate 110. Through the thermal oxide process, the top surface 120a of the semiconductor fin is partially oxidized, such that a silicon oxide layer 112 that substantially has the same thickness as the buried insulating layer 111 may be formed. The next processes may be similar to those of the above modifications.

Figure 3A:
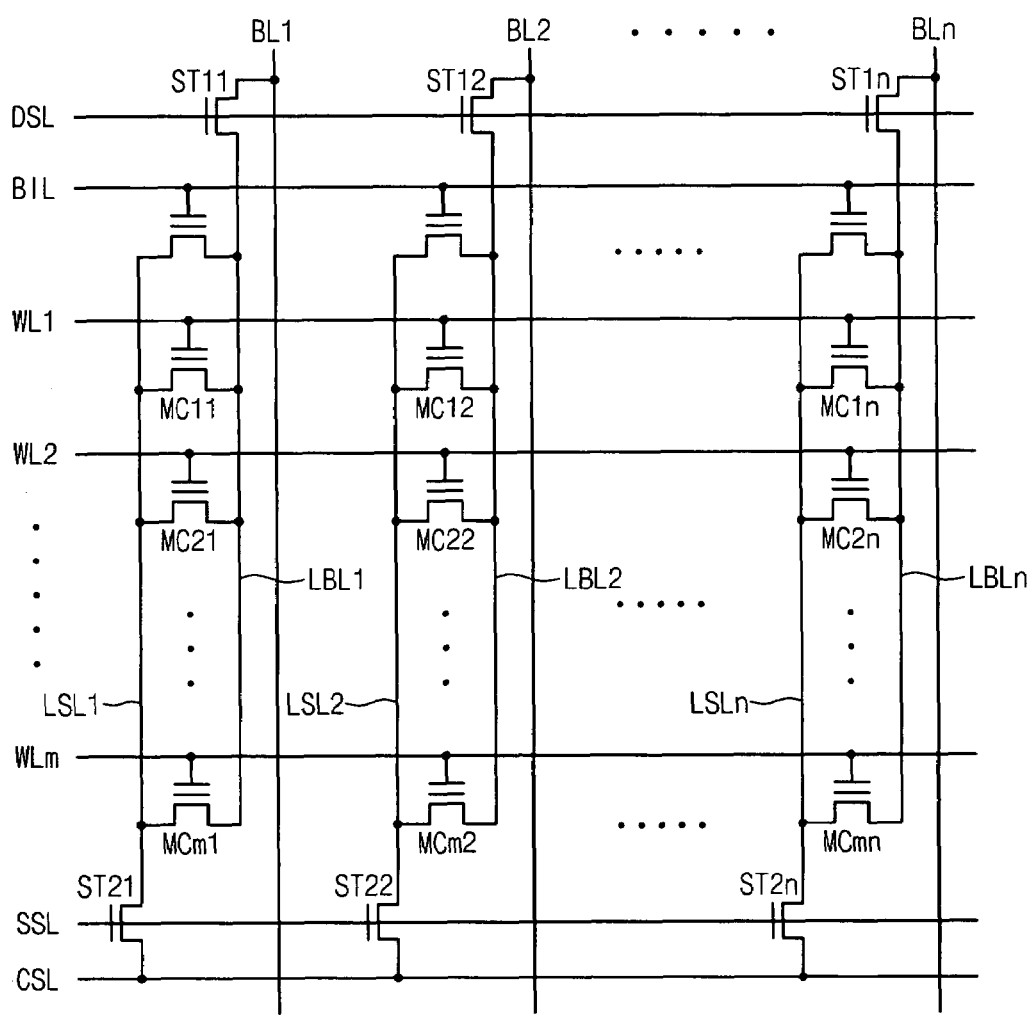
FIGS. 3A through 3C are a circuit diagram, a layout, and a perspective view, respectively, of an AND flash memory device according to a an embodiment of the present invention.
Figure 3B:
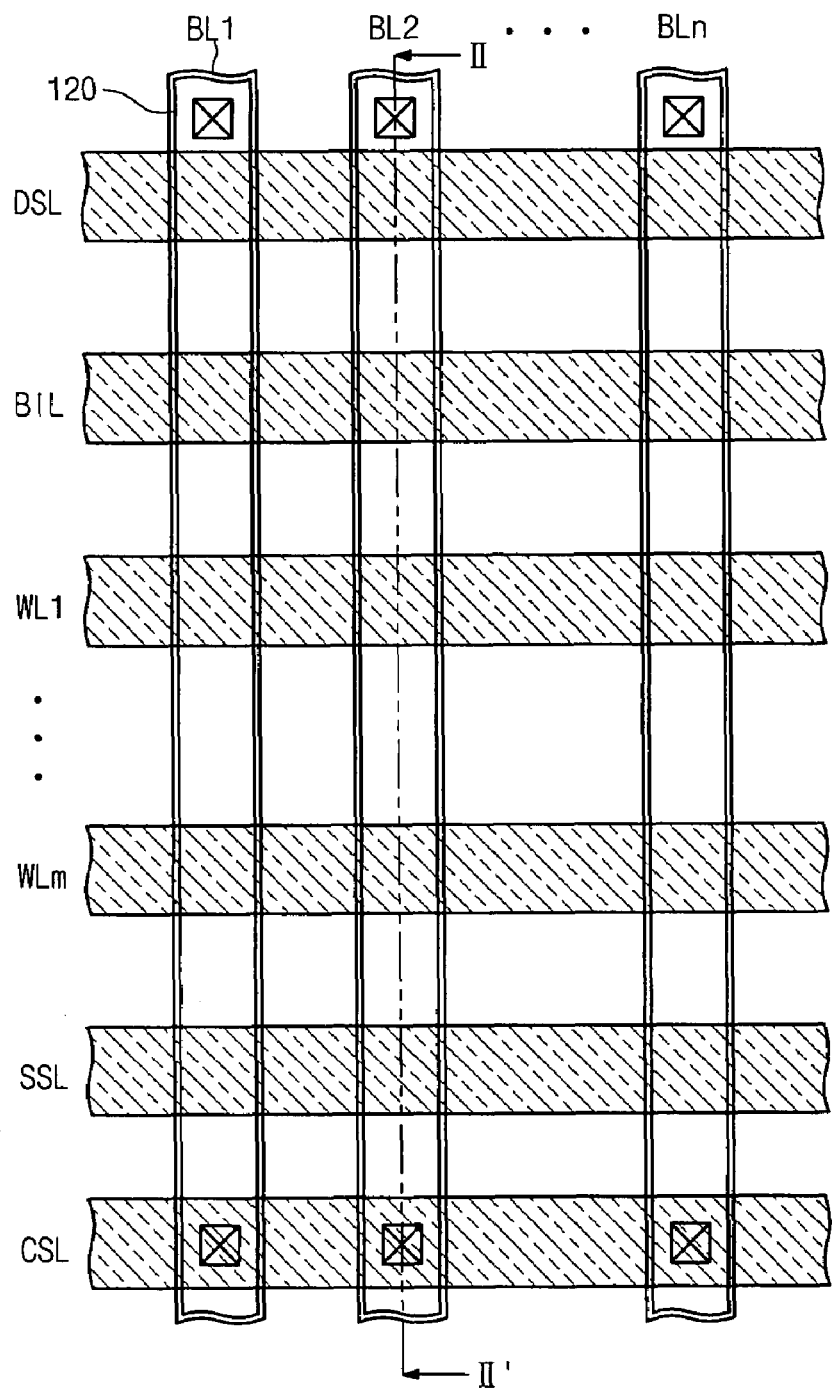
Figure 3C:
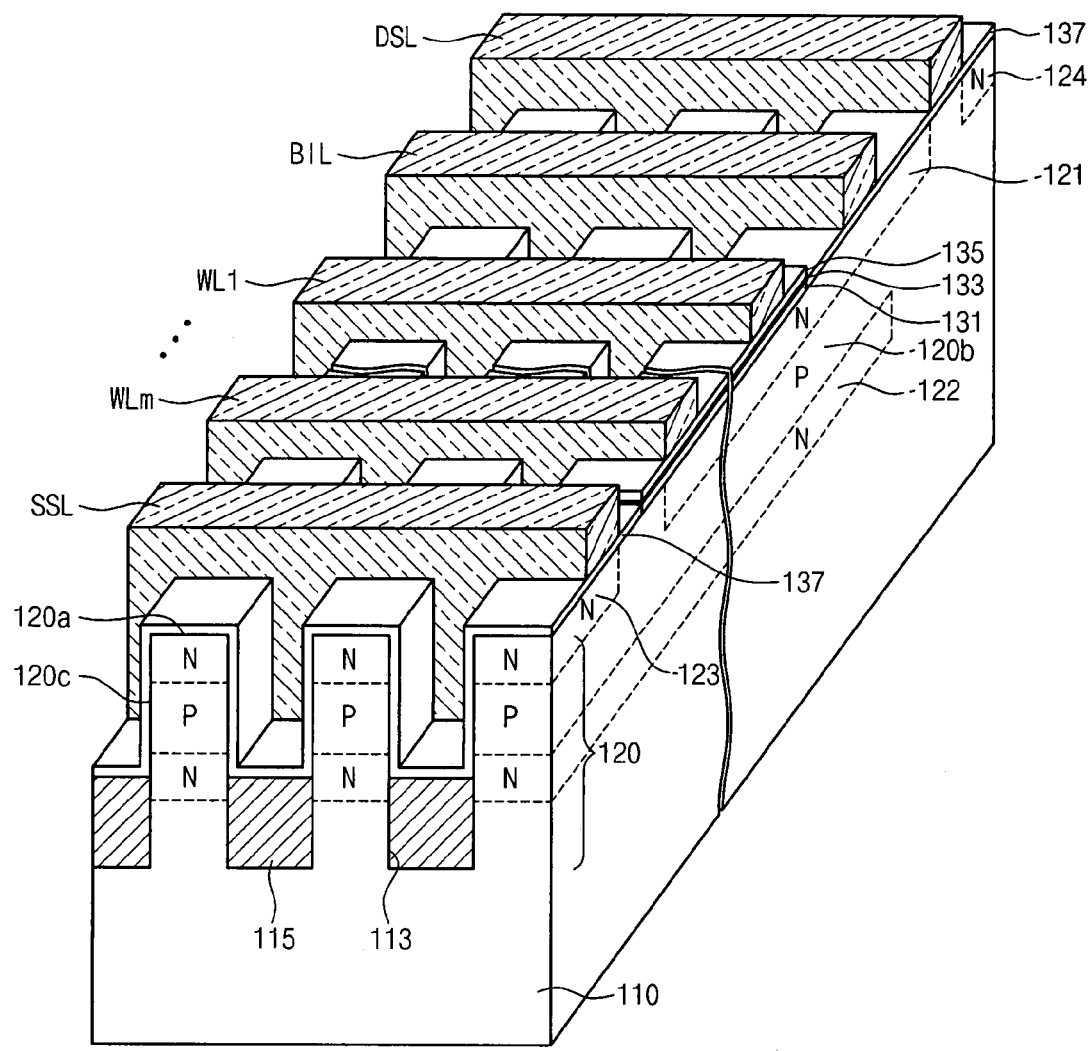
Figure 3D:
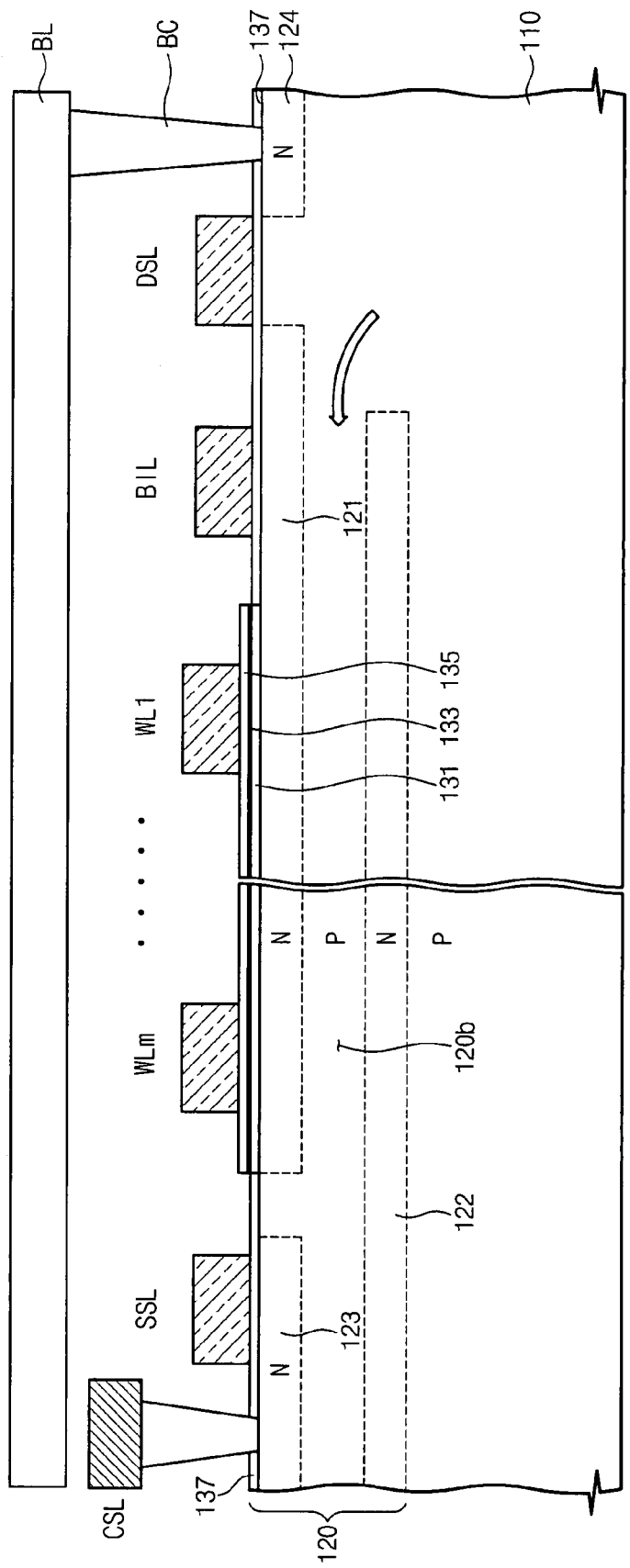
FIG. 3D is a sectional view taken along line II-II' of FIG. 3B.

Referring to FIG. 3C, a method of fabricating the AND flash memory device according to the second embodiment is described. A gate insulating layer 137 is formed on the top surface 120a and the side surface 120c of the exposed semiconductor fin 120 at the semiconductor substrate 110 of FIG. 7D. A gate layer (not shown) is formed on the blocking insulating layer 135 and the gate insulating layer 137 to fill the grooves 113. The gate layer may be a polysilicon layer, a metal layer, or a stacked layer thereof.

The gate layer is patterned. A plurality of word lines WL1, WL2, ..., WLm overlapping the first doping layer 121 and the second doping layer 122, a source select line SSL overlapping the second doping layer 122 and the third doping layer 123, and the drain select line DSL spaced apart from the first doping layer 121 and the second doping layer 122 are formed. Furthermore, a body isolation line BIL overlapping the first doping layer 121 and the second doping layer 122 is additionally formed. The body insulating layer BIL is formed between the drain select line DSL and the word line WL1 that is the most adjacent to the drain select line DSL.

The word lines WL1, WL2, ..., WLm, the drain select line DSL, the source select line SSL, and the body isolation line BIL intersect the direction, and extend over the top surface 120a and the side surface 120c of the semiconductor fin 120 and over the isolation insulating layer 115. The tunnel insulating layer 131, the charge storage layer 133, and the blocking insulating layer 135 may be interposed between the word lines WL1, WL2, ..., WLm and the semiconductor fin 120. A gate insulating layer 137 may be interposed between the drain select line DSL, the source select line SSL, the body isolation line BIL, and the semiconductor fin 120. The next process may be the same as the process referring to FIG. 7F.

Figure 12A:
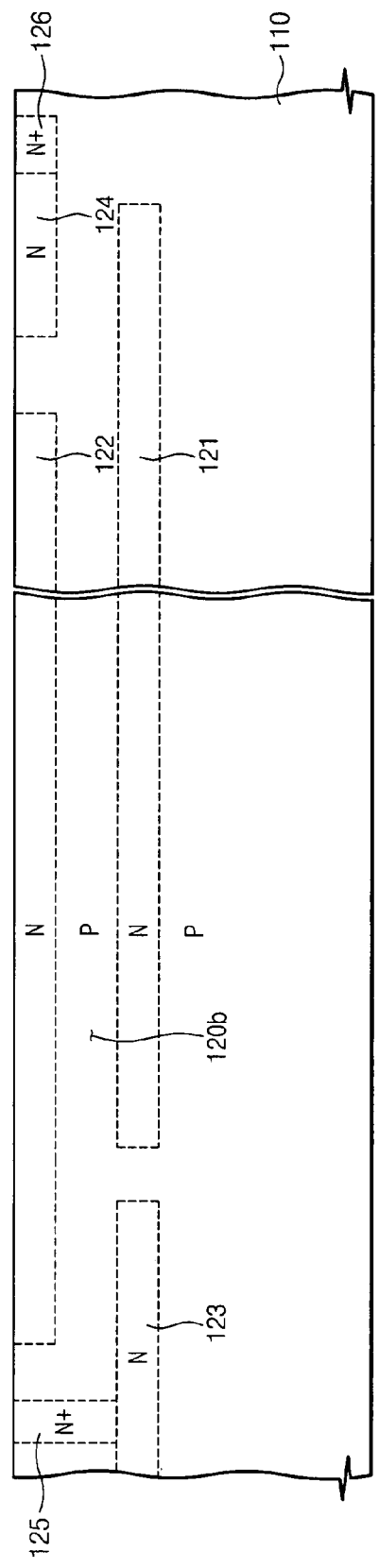
FIGS. 12A through 12C are sectional views taken along line II-II' of FIG. 4B and illustrating a method of fabricating an AND flash memory device according to an embodiment of the present invention.

A method of fabricating the AND flash memory device according to the third embodiment is described. Referring to FIG. 12A, a second doping layer 122 and a fourth doping layer 124 are formed in an upper portion of the semiconductor substrate 110 having a first conductive type, e.g., a p-conductive type. The fourth doping layer 124 is spaced apart from the second doping layer 122 in one direction. The second doping layer 122 and the fourth doping layer 124 have the second conductive type, e.g., an n-conductive type.

The first doping layer 121 and the third doping layer 123 having the second conductive type are formed in a lower portion of the semiconductor substrate 110 that is vertically spaced apart from the second doping layer 122 and the fourth doping layer 124. The third doping layer 123 is spaced apart from the first doping layer 121 in the direction. The second doping layer 122 and the fourth doping layer 124 partially overlap the first doping layer 121. The third doping layer 123 may partially overlap the second doping layer 122. A fifth doping layer 125 is formed in the upper portion of the semiconductor fin 120 that is spaced apart from the second doping layer 122 in the direction. The fifth doping layer 125 extends to the third doping layer 123, and thus serves as a contact that connects the third doping layer 123 with an external line. A sixth doping layer 126 connected to the fourth doping layer 124 may be formed in the upper portion of the semiconductor fin 120. The fifth doping layer 125 and the sixth doping layer 126 are the second conductive type, and have a higher concentration than other doping layers.

A well-known ion implantation process is performed to form the first doping layer 121, the second doping layer 122, the third doping layer 123, the fourth doping layer 124, the fifth doping layer 125 and the sixth doping layer 126. The impurity concentration of the ion implanted doping layers may be adjusted to have a concentration for forming a source and a drain. The vertically spaced distance is about 100 nm.

Next, the semiconductor fins 120, the isolation insulating layer 115, the tunnel insulating layer 131, the charge storage layer 133, the blocking insulating layer 135, and the gate insulating layer 137 are formed as illustrated in FIGS. 7B through 7D. A gate insulating layer 137 is formed.

Figure 12B:
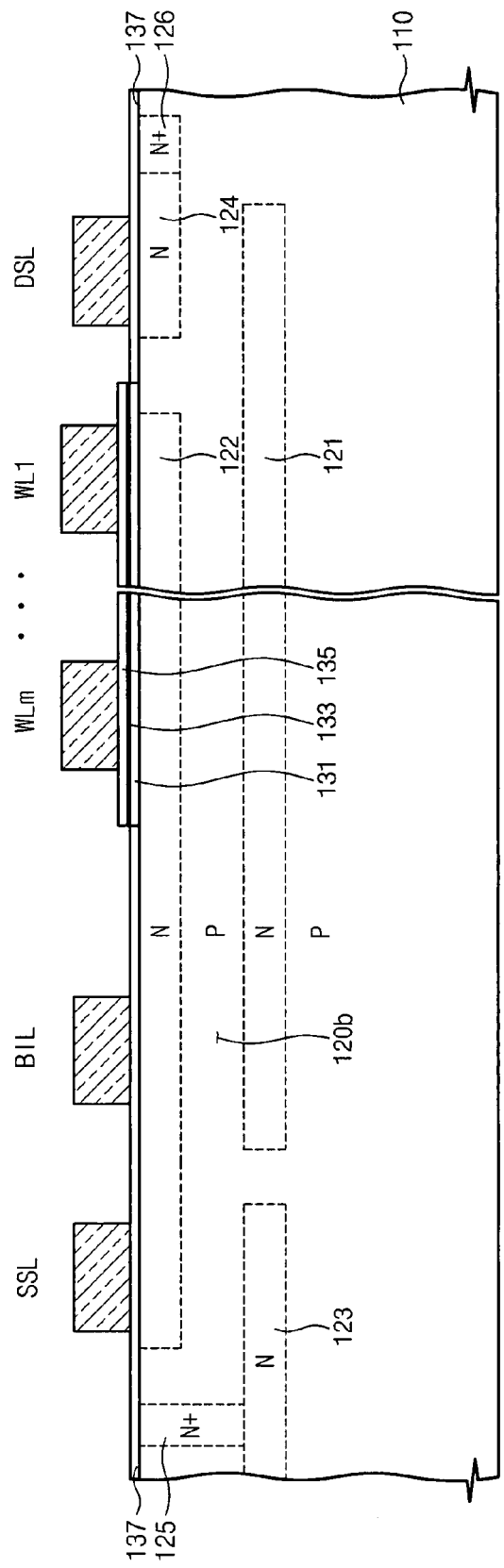

Referring to FIG. 12B, a gate layer (not shown) is formed on the blocking insulating layer 135 and the gate insulating layer 137 to fill the grooves, similar to FIG. 7E. The gate layer is a polysilicon layer, a metal layer, or a stacked layer thereof. The gate layer is patterned. The word lines WL1, WL2, ..., WLm overlapping the first doping layer 121 and the second doping layer 122, the drain select line DSL overlapping the first doping layer 121 and the fourth doping layer 124, and the source select line SSL overlapping the second doping layer 122 and the third doping layer 123 are formed. Furthermore, a body isolation line BIL overlapping the first doping layer 121 and the second doping layer 122 is additionally formed.

The body isolation line BIL is formed between the source select line SSL and the word line that is the most adjacent to the source select line SSL.

The word lines WL1, WL2, ..., WLm, the drain select line DSL, and the source select line SSL intersect the direction, and extend over the top surface 120a and the side surface 120c of the semiconductor fin 120 and over the isolation insulating layer 115. The tunnel insulating layer 131, the charge storage layer 133, and the blocking insulating layer 135 may be interposed between the word lines WL1, WL2, ..., WLm and the semiconductor fin 120. A gate insulating layer 137 may be interposed between the drain select line DSL, the source select line SSL, the body isolation line BIL, and the semiconductor fin 120.

Figure 4A:
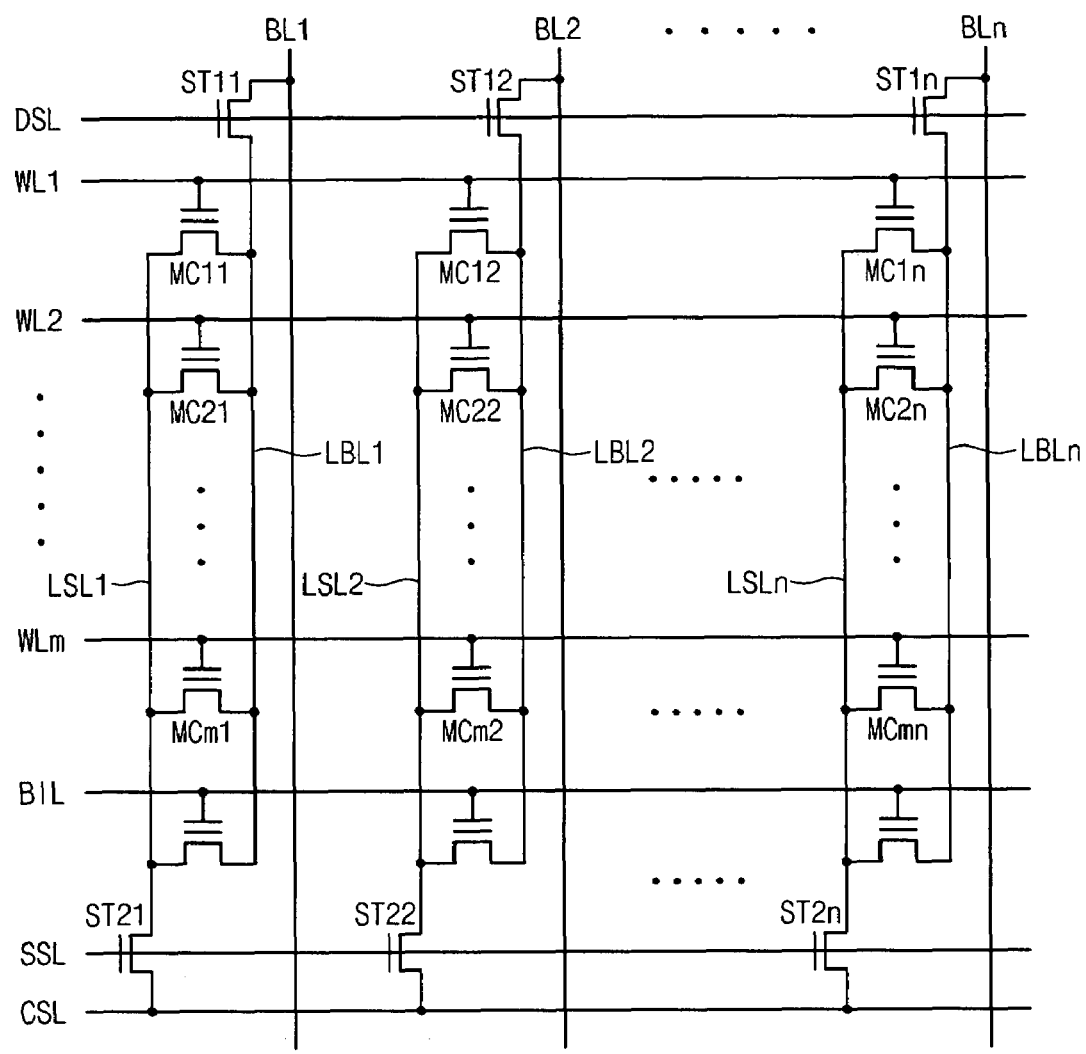
FIGS. 4A through 4C are a circuit diagram, a layout, and a perspective view, respectively, of an AND flash memory device according to an embodiment of the present invention.
Figure 4B:
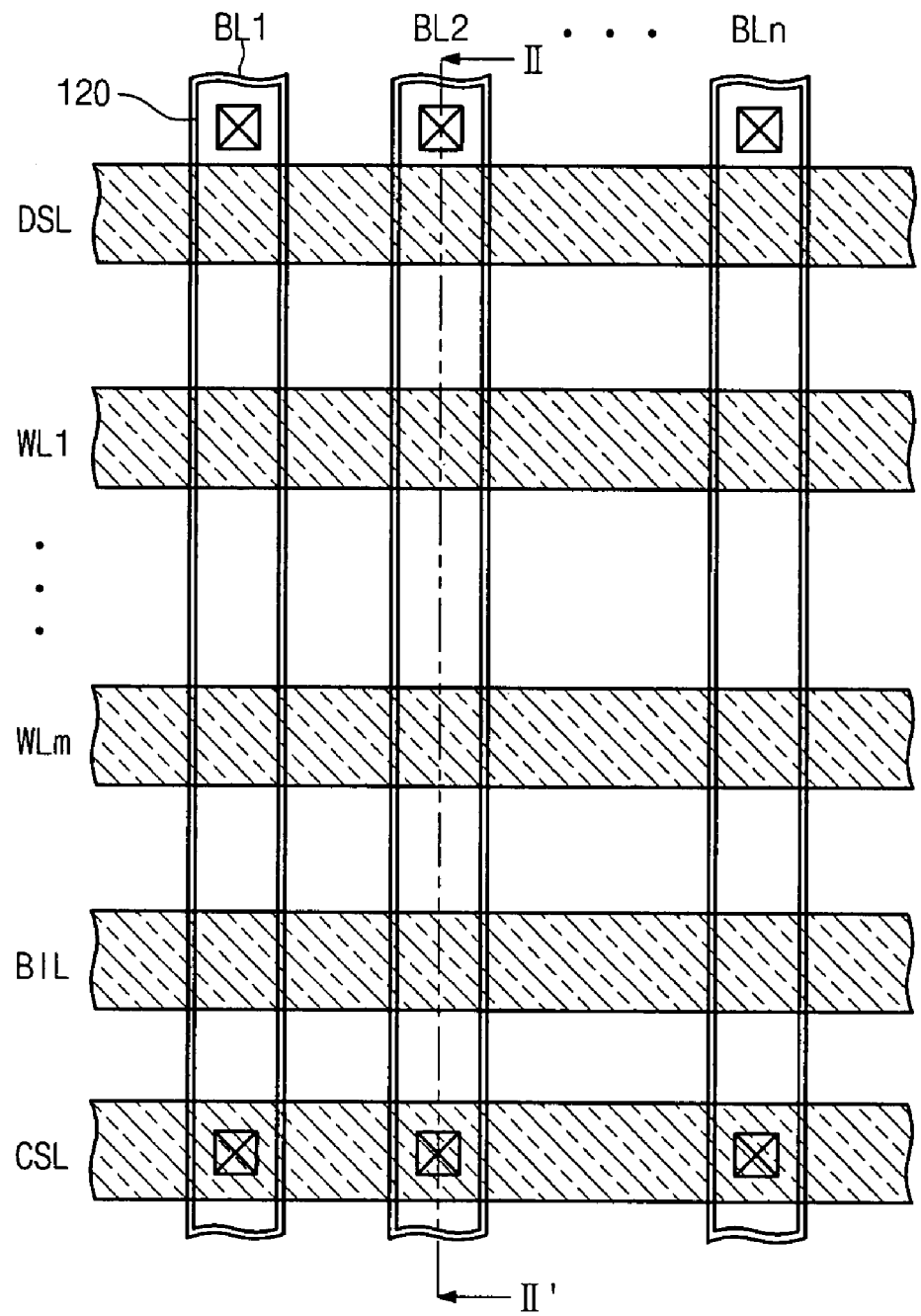
Figure 4C:
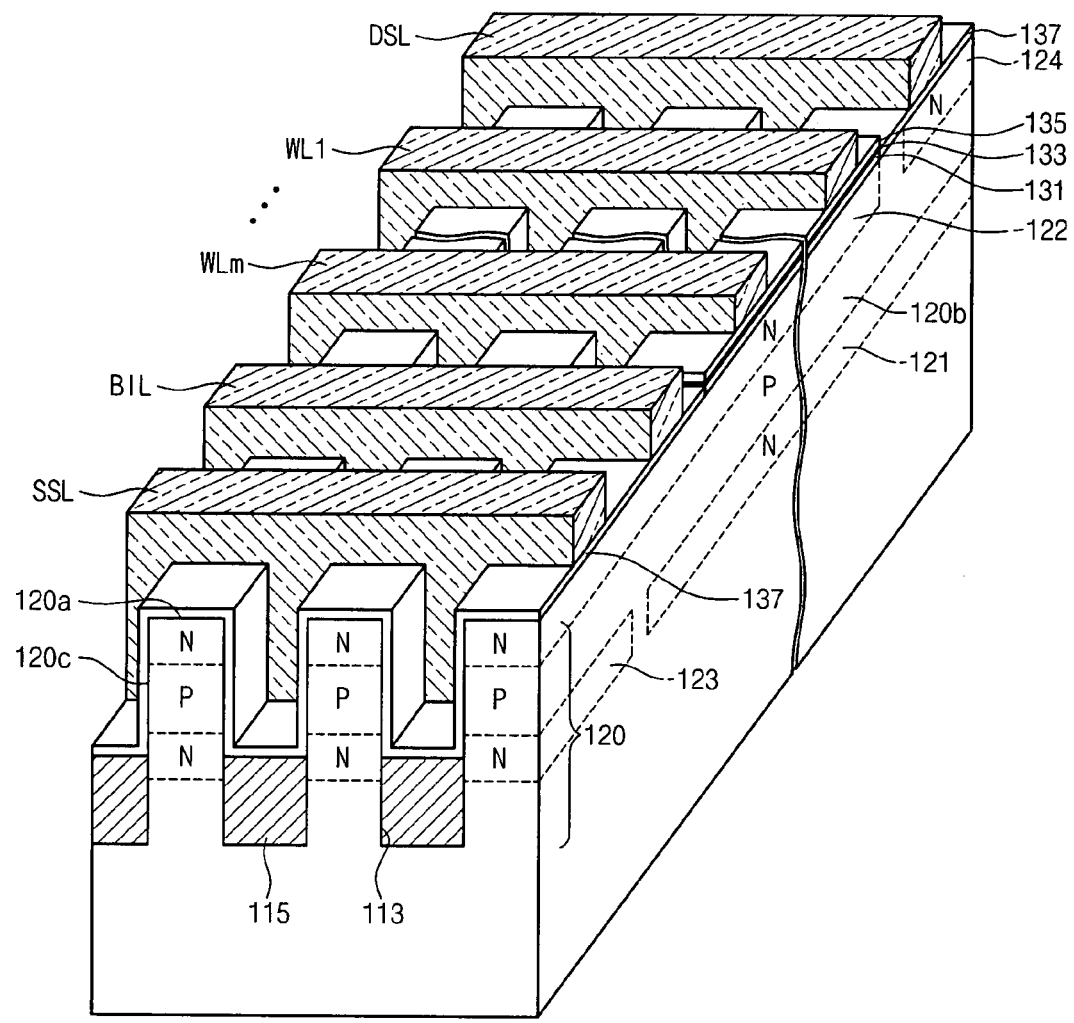
Figure 4D:
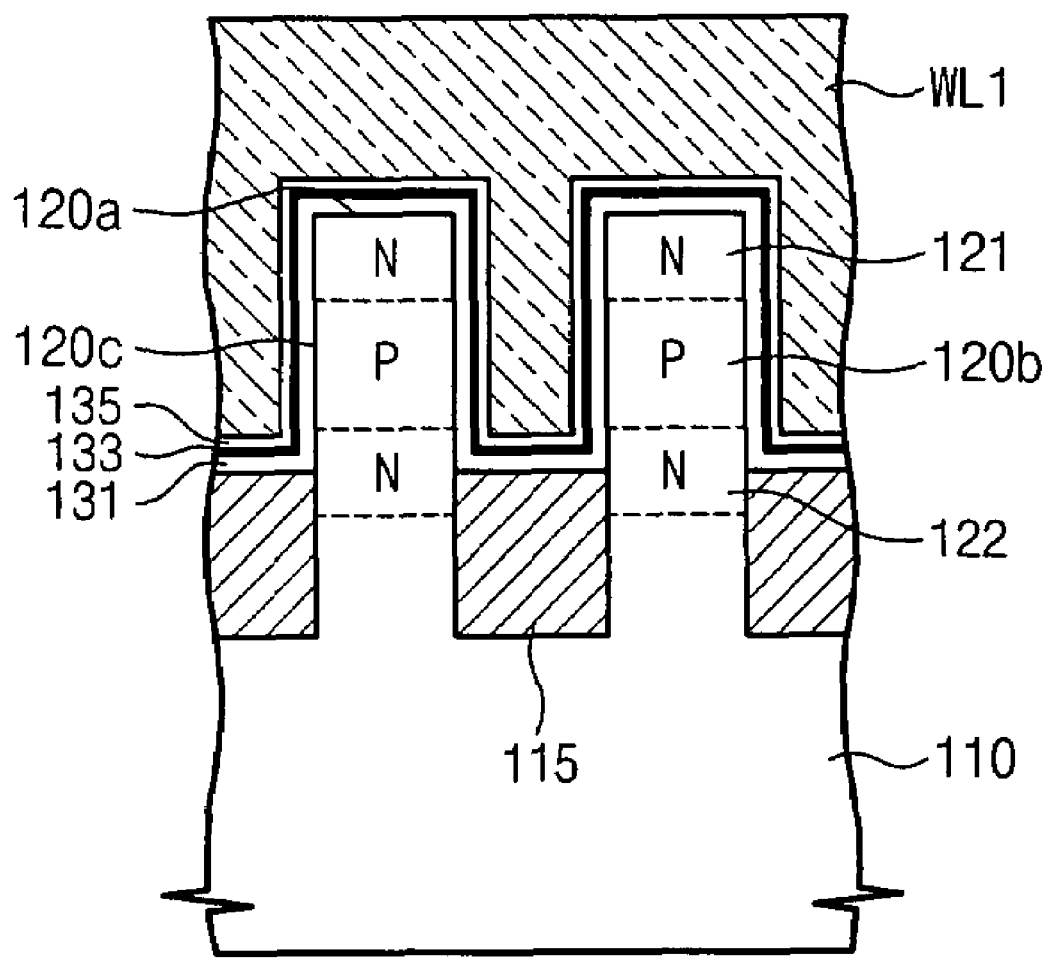
FIGS. 4D and 4E are sectional views taken along line I-I' and line II-II' of FIG. 4B, respectively.
Figure 4E:
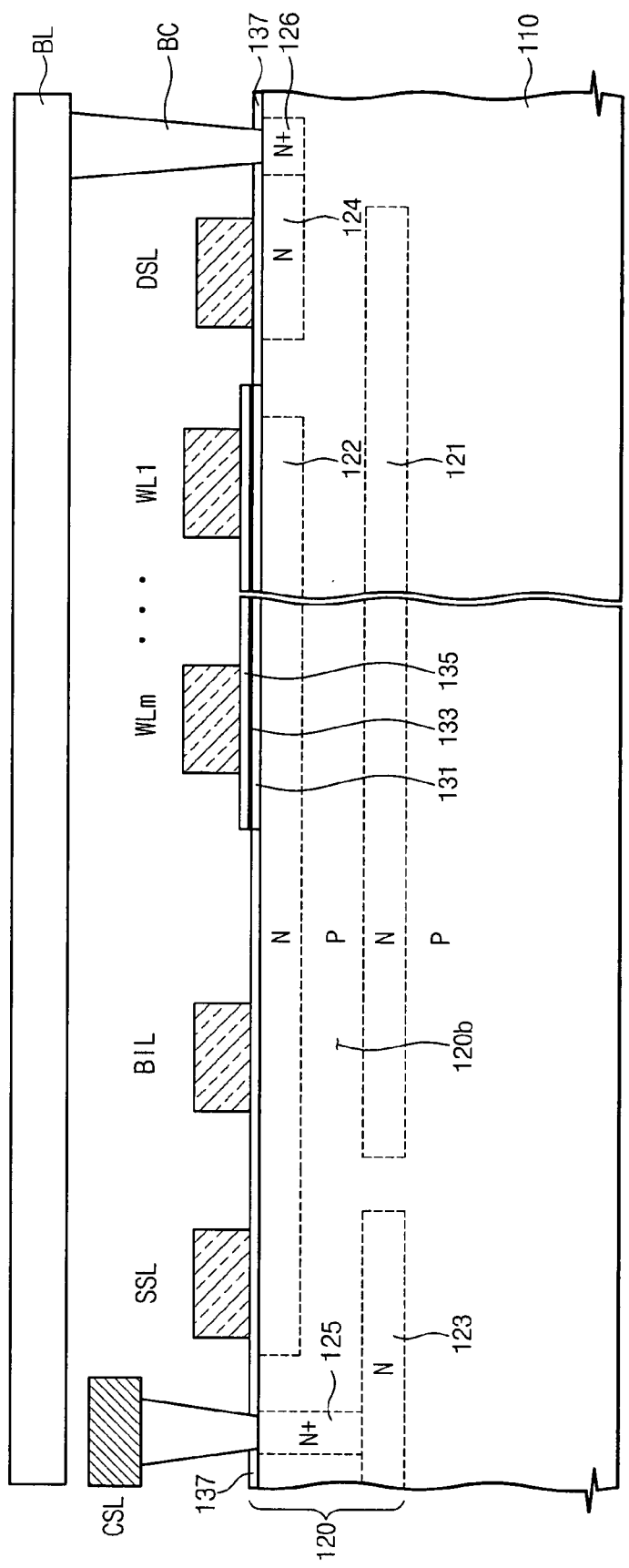
Figure 12C:
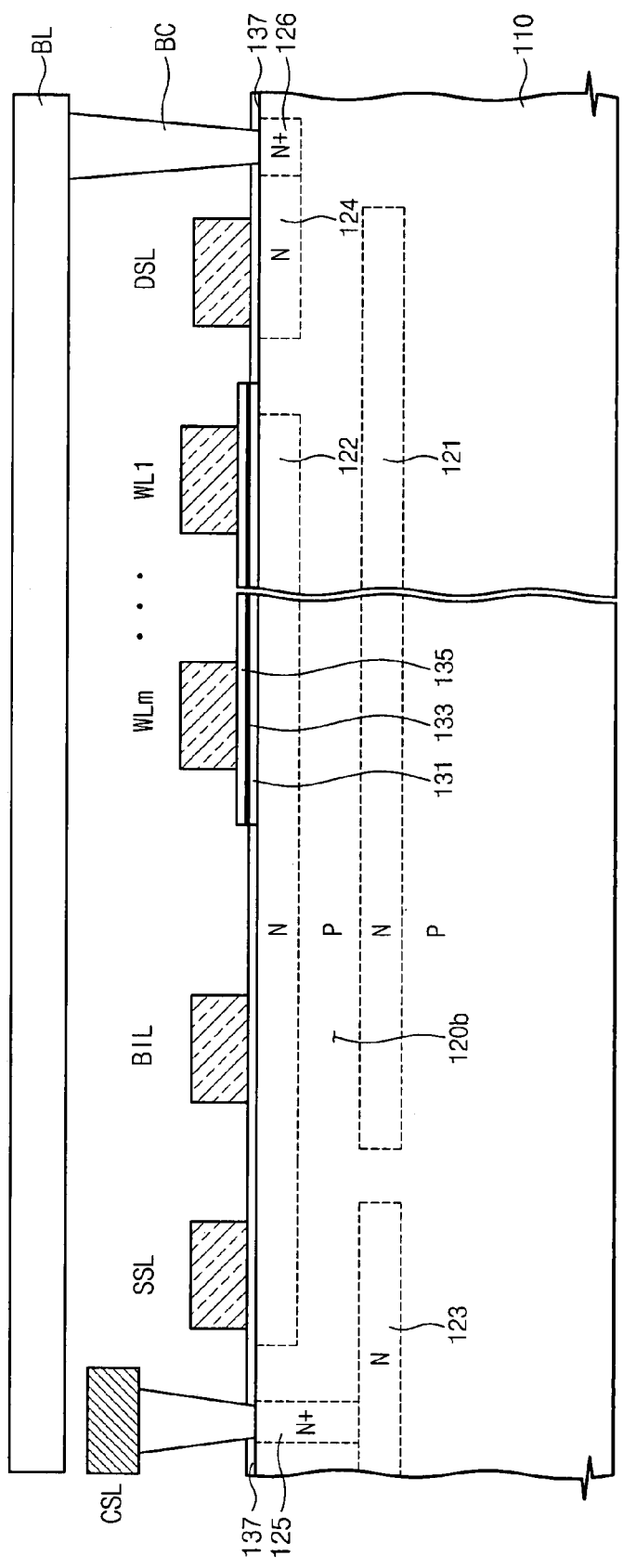

Referring to FIGS. 12C and 4C, a first interlayer insulating layer is formed to cover the semiconductor substrate. The first interlayer insulating layer may be a silicon oxide layer, for example BPSG layer. An opening exposing the fifth doping layer 125 is formed by etching the first interlayer insulating layer. A common source line CSL of a conductive pattern is formed in the opening.

A second interlayer insulating layer is formed to cover the semiconductor substrate 110. The second interlayer insulating layer may be a silicon oxide layer, for example BPSG layer. An opening exposing the fourth doping layer 126 is formed. A contact plug BC is formed in the opening, and a bit line BL connected to the contact plug is formed on the second interlayer insulating layer.

Figure 13A:
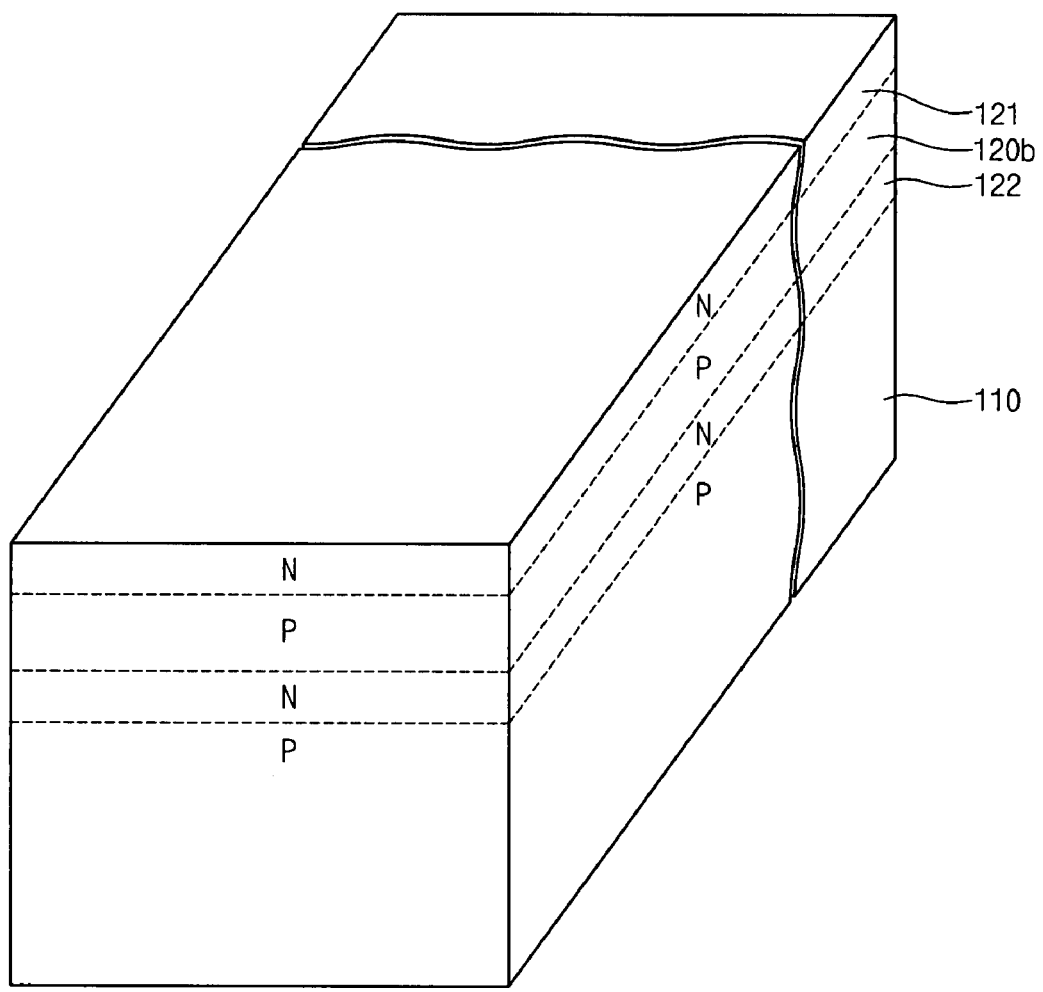
FIGS. 13A and 13B are perspective views illustrating a method of fabricating a NOR flash memory device according to an embodiment of the present invention.

A method of fabricating the NOR type flash memory device according to the fourth embodiment is described. Referring to FIG. 13A, a first doping layer 121 is formed in an upper portion of the semiconductor substrate 110 having a first conductive type, e.g., a p-conductive type. The first doping layer 121 has the second conductive type, e.g., an n-conductive type. A second doping layer 122 having the second conductive type is formed in a lower portion of the semiconductor substrate 110 that is vertically spaced apart from the first doping layer in one direction. A third doping layer (not shown) having the second conductive type may be formed in the upper portion of the semiconductor substrate. The third doping layer may have a higher concentration than other doping layers. The third doping layer extends to the second doping layer 122, and may serve as a contact that connects the second doping layer 122 with an external line.

A well-known ion implantation process is performed to form the first doping layer 121 the second doping layer 122, and the third doping layer. The impurity concentration of the ion implanted doping layers may be adjusted to have a concentration for forming a source and a drain. The vertically spaced distance is about 100 nm.

Figure 13B:
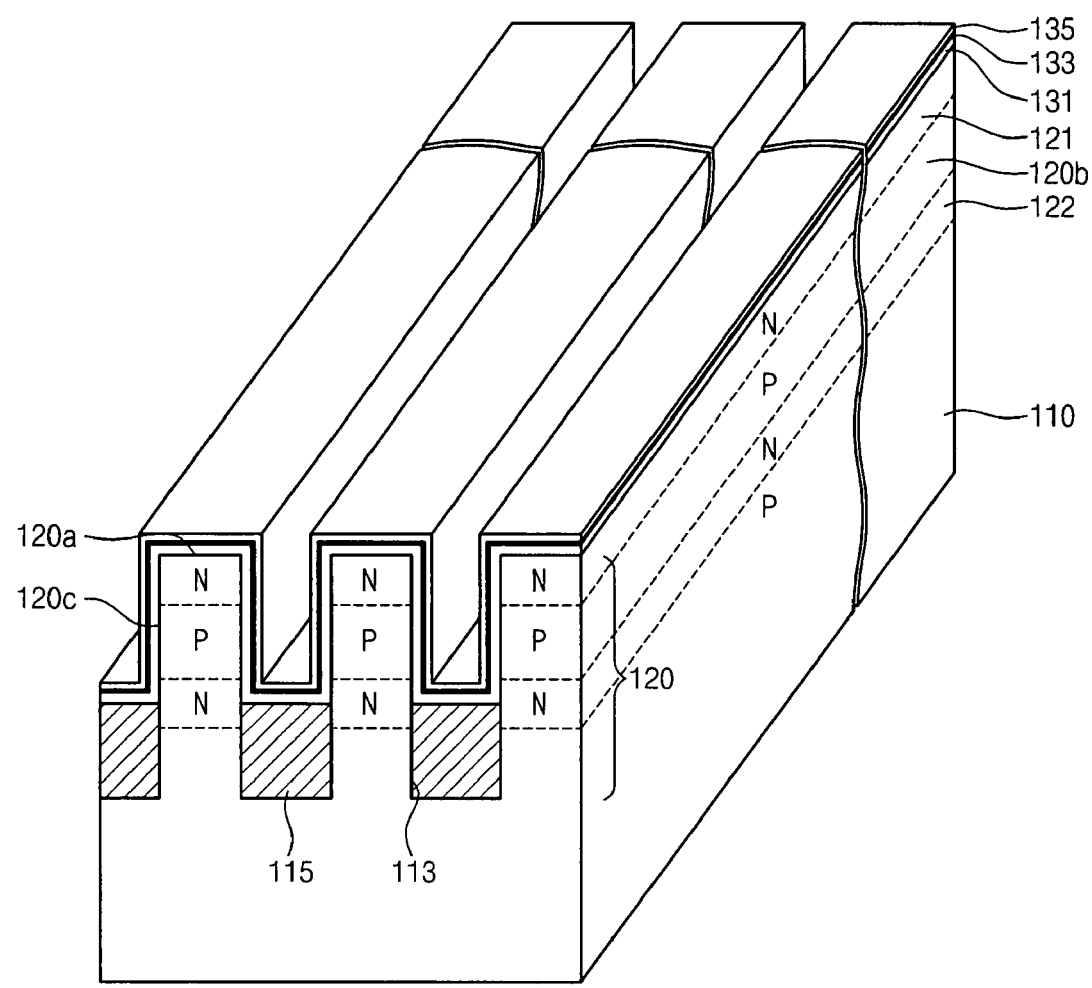

Referring to FIG. 13B, semiconductor fins 120 having the first doping layer 121, the second doping layer 122 and body regions 120b therebetween are formed between the grooves 113, as illustrated in FIGS. 7B and 7C. The grooves 113 have the depth that separates the second doping layer 122 of the semiconductor fin 120 from the second doping layer 122 of other semiconductor fins adjacent to the semiconductor fin 120. An isolation insulating layer 115 is formed to fill the bottom of the grooves 113. A tunnel insulating layer 131, a charge storage layer 133, and a blocking insulating layer 135 are sequentially formed to cover the top surface 120a and the side surface 120c of the semiconductor fin 120 and the isolation insulating layer 115.

Referring to FIG. 5B again, a gate layer (not shown) is formed on the blocking insulating layer 135 and the gate insulating layer 137 to fill the grooves 112. The gate layer is a polysilicon layer, a metal layer, or a stacked layer thereof.

The gate layer is patterned. The word lines WL1, WL2, ..., WLm overlapping the first doping layer 121 and the second doping layer 122 are formed. The word lines WL1, WL2, ..., WLm extend over the top surface 120a and the side surface 120c of the semiconductor fin 120 and over the isolation insulating layer 115. The tunnel insulating layer 131, the charge storage layer 133, and the blocking insulating layer 135 are interposed between the word lines WL1, WL2, ..., WLm and the semiconductor fin 120.

Figure 14:
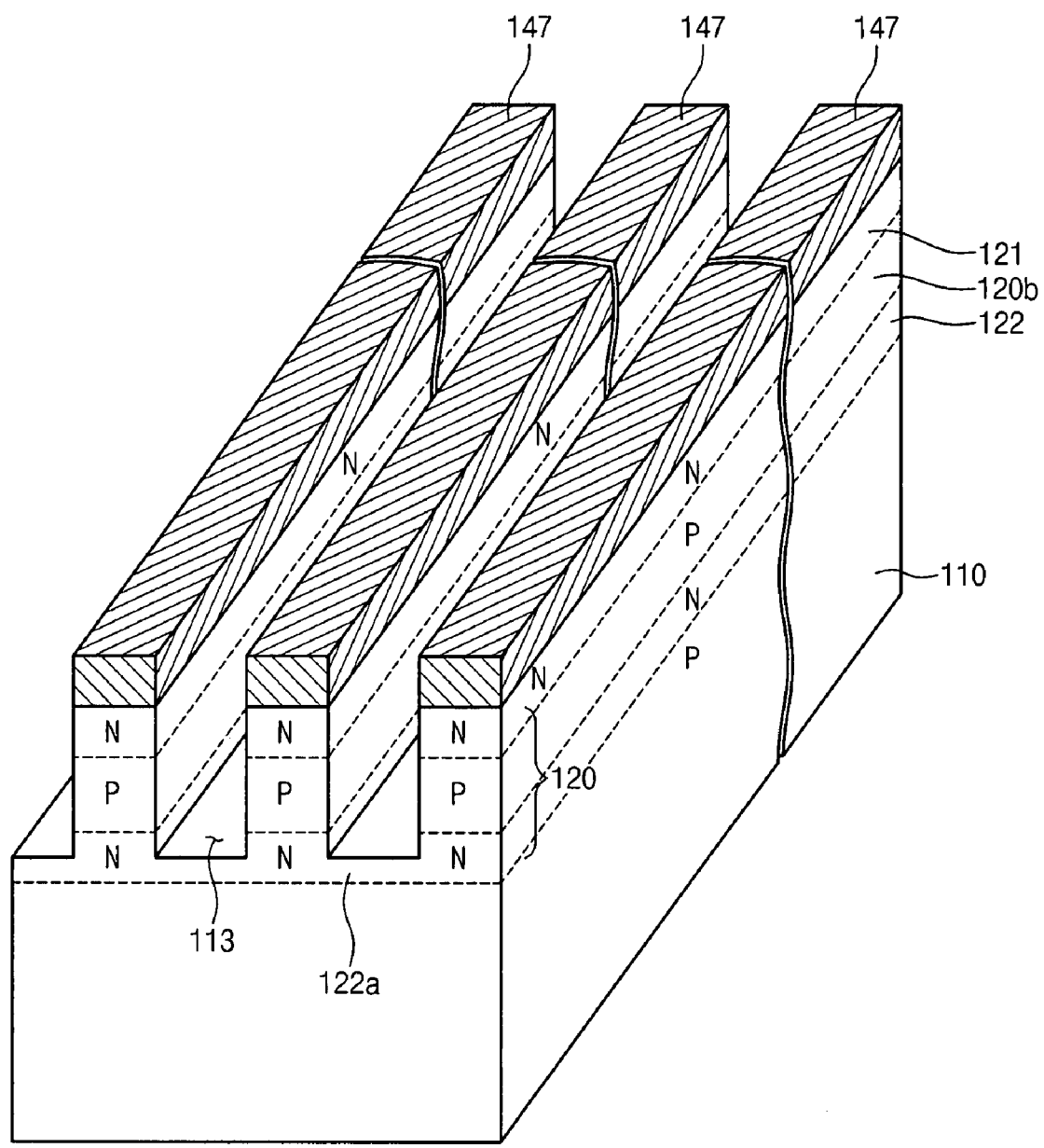
FIG. 14 is a perspective view illustrating a method of fabricating a NOR flash memory device according to a modification of a fourth embodiment.

A method of fabricating the NOR type flash memory device 100 according to a modification of the fourth embodiment is described. Referring to FIG. 14, the semiconductor substrate 110 of FIG. 13A is etched through an etching process that uses a fourth mask pattern 147 extending in one direction. The fourth mask pattern 147 may be a silicon nitride layer. Grooves 113 having the side that exposes the first doping layer 121 and the second doping layer 122 are formed. A plurality of semiconductor fins 120 having the first doping layer 121, and the second doping layer 122 and having body regions 120b therebetween are formed between the grooves 113. The grooves 113 have the depth that does not separate the second doping layer 122 of the semiconductor fin 120 from the second doping layer 122 of other semiconductor fins adjacent to the semiconductor fin 120. That is, the lower portion 122a of the second doping layer 122 remains. The fourth mask pattern 147 is removed.

Referring to FIG. 5C again, next, the tunnel insulating layer 131, the charge storage layer 133, and the blocking insulating layer 135 are sequentially formed to cover the top surface 120a and the side surface 120c of the semiconductor fin 120 and the isolation insulating layer 115. A gate layer (not shown) is formed on the blocking insulating layer 135 to fill the grooves 113. The gate layer may be a polysilicon layer, a metal layer or a staked layer thereof. The gate layer is patterned. The word lines WL1, WL2, ..., WLm overlapping the first doping layer 121 and the second doping layer 122 are formed. The word lines WL1, WL2, ..., WLm extend over the top surface 120a and the side surface 120c of the semiconductor fin 120 and over the isolation insulating layer 115. The tunnel insulating layer 131, the charge storage layer 133, and the blocking insulating layer 135 are interposed between the word lines WL1, WL2, ..., WLm and the semiconductor fin 120.

Hereinafter, a method of operating a flash memory device according to the embodiments of the present invention is described.

A method of operating the AND flash memory device of FIGS. 3A and 4A is described with reference to FIG. 15. First, a program operation is described. A first voltage is applied to the drain select line DSL and a second voltage is applied to the source select line SSL to turn off the second select transistor ST21. The second voltage lower than the first voltage is applied to the bit line connected to the selected memory cell MC11 to turn on the first select transistor ST11, and a third voltage equal to or higher than the first voltage is applied to the bit lines connected to the unselected memory cells. A fourth voltage higher than the second voltage is applied to the word line WL1 connected to the selected memory cell MC11, and a fifth voltage equal to the second voltage and lower than the fourth voltage is applied to word lines connected to the unselected memory cells. The second voltage is applied to the common source line CSL and a ground voltage is applied to the semiconductor substrate 110.

A sixth voltage is applied to the body isolation line BIL to completely deplete the body region of the semiconductor fin 120 surrounded by the body isolation line BIL. The sixth voltage may be a supply voltage Vcc. As illustrated with reference to FIGS. 6A and 6B, the body region 120b of the memory cell floats through substrate bais, e.g., the ground voltage, such that self-boosting of the unselected memory cells easily occurs. Accordingly, unlike a typical method during a program operation, a relatively high pass voltage Vpass may not be necessarily applied to the unselected word lines. Furthermore, a relatively high write prohibit voltage Vinh may not be necessarily applied to the unselected bit lines. For example, the third voltage applied to the unselected bit lines may be a supply voltage Vcc, and the fifth voltage applied to the unselected word lines may be the ground voltage. The first voltage, the second voltage, and the fourth voltage may be the supply voltage Vcc, the ground voltage, and the program voltage, respectively. The program voltage may range from about 10 V to about 14 V.

An erase operation is described. A seventh voltage, which does not completely deplete the body region 120b of memory cells in a specific block, is applied to the word lines of the memory cells in the specific block including the selected memory cell and disposed between the drain select line DSL and the source select line SSL. An eighth voltage higher than the seventh voltage is applied to the semiconductor substrate 110 to remove the charges in the memory cells of the specific block into the body region 120b through F-N tunneling. The memory cells of the specific block are simultaneously erased by floating the remaining lines. For example, the seventh voltage and the eighth voltage are the ground voltage and the erase voltage, respectively.

A read operation is described. A ninth voltage is applied to the body isolation line BIL not to completely deplete the body region 120b of the semiconductor fin 120 surrounded by the body isolation line BIL. A tenth voltage is applied to the source select line SSL to turn on the second select transistor ST21. An eleventh voltage higher than the ground voltage is applied to the word line WL1 connected to the selected memory cell MC11. The first voltage higher than the ground voltage is applied to the drain select line DSL to turn on the first select transistors ST11. A twelfth voltage higher than the ground voltage is applied to the bit line BL1 connected to the selected memory cell. The ground voltage is applied to the common source line CSL, the word lines connected to the unselected memory, unselected bit lines, and the semiconductor substrate 110. For example, the ninth voltage is the ground voltage. The tenth and eleventh voltages are the supply voltage Vcc. The twelfth voltage is a read voltage Vread.

Figure 16:
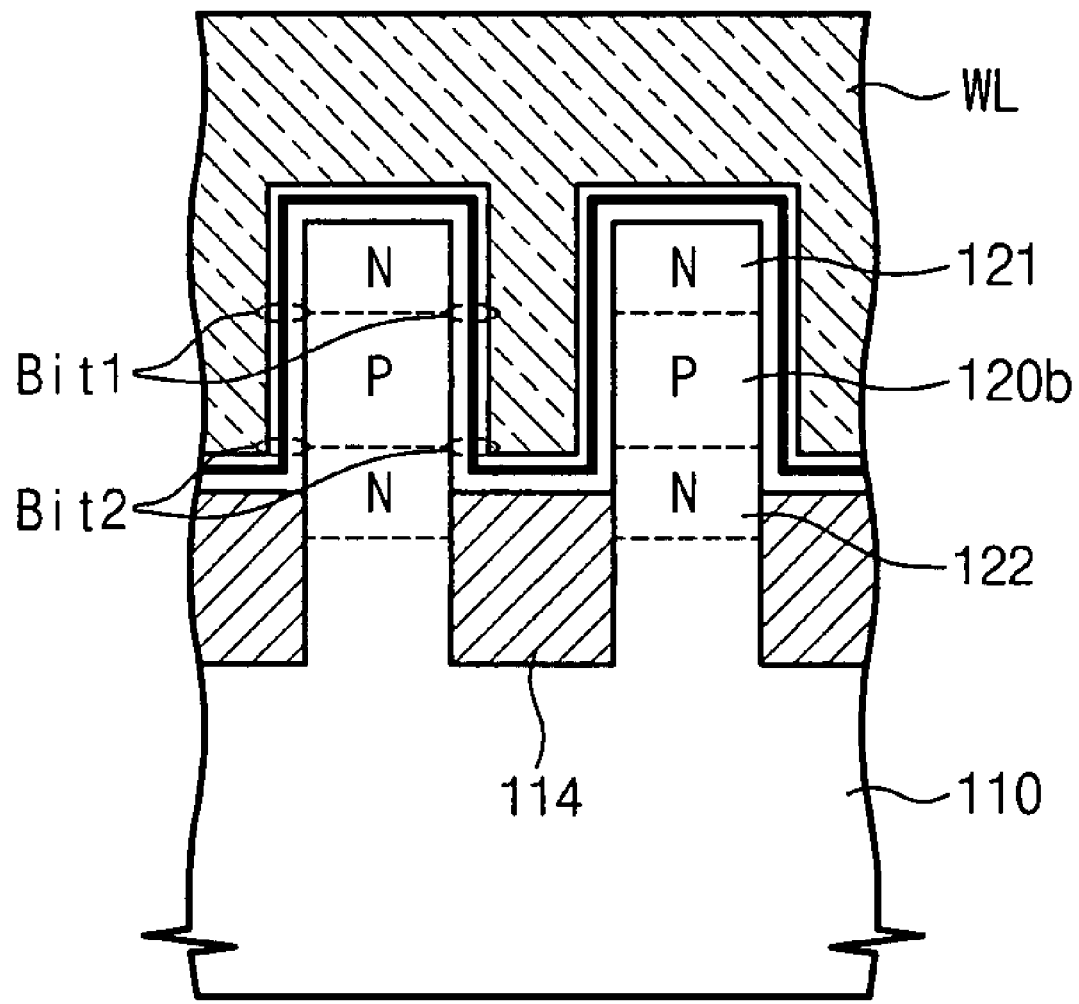
FIG. 16 is a sectional view illustrating exemplary methods of operating a NOR flash memory device according to the present invention.

A method of operating the NOR flash memory device of FIGS. 5A and 5C is described with reference to FIG. 16.

The NOR flash memory device according to the embodiments of the present invention may be programmed through a multi-bit. The case where electrons are injected to the charge storage layer at the drain of the selected memory cell is described. A program voltage is applied to the word line of the selected memory cell. The word lines of the unselected memory cells and the unselected bit lines may float or be grounded. A first write voltage higher than the ground voltage is applied to the bit line connected to the selected memory cell. The ground voltage is applied to the common source line CSL. Accordingly, the charge storage layer at the drain of the selected memory cell is programmed through a channel hot electron injection method. The case where electrons are injected into the charge storage layer at the drain of the selected memory cell is described. A program voltage is applied to the word line of the selected memory cell. The word lines of the unselected memory cells and the unselected bit lines may float or be grounded. The ground voltage is applied to the bit line connected to the selected memory cell. A second write voltage higher than the ground voltage is applied to the common source line. Accordingly, the charge storage layer at the source of the selected memory cell is programmed through a channel hot electron injection method.

The NOR memory cell of the present invention has a double gate structure of a vertical channel. Accordingly, due to the electrical repulsive power of electrons injected on both sides of the drain or on both sides of source, the electrons injected on a storage node less moves toward the channel compared to the plane channel or a single gate structure. Therefore, program reliability can be improved.

On the other hand, independent biasing is possible in each body region 120b of the semiconductor fins according to the NOR memory cell of the present invention. Accordingly, a voltage lower than the ground voltage is applied to the body region 120b of the semiconductor fin 120 having the selected memory cell. A voltage higher than the ground voltage or the floating voltage is applied to the body region 120b of other semiconductor fin having the unselected memory cell. Therefore, program reliability can be improved.

A method of erasing the NOR flash memory device of the present invention is described. An erase voltage is applied to all the word lines of the block including the selected memory cells not to completely deplete the body region 120b of the memory cells connected to the word lines. A voltage higher than the erase voltage is applied to the body biasing terminal for F-N tunneling of electrons in the body region 120b of the memory cells connected to all the word line of the block having the selected memory cell. The memory cells of the block are simultaneously erased by floating the remaining lines.

A method of reading the NOR flash memory device of the present invention is described. A read voltage higher than the ground voltage and lower than the program voltage is applied to a word line crossing the memory cell in order to turn on the memory cells connected to the word line. The ground voltage or a voltage lower than the ground voltage is applied to the remaining word lines to turn off the memory cells connected to the remaining word lines, such that a lead voltage is applied from the drain to the source or from the source to the drain in the selected memory cell.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A flash memory device comprising:
   a local bit line connected to a bit line on a semiconductor substrate having a first conductive type;
   a semiconductor fin protruding from the semiconductor substrate to extend in one direction;
   a local source line connected to a common source line intersecting the bit line;
   a plurality of memory cells connected in parallel to the local bit line and the local source line, wherein the local bit line and the local source line are vertically spaced apart from each other in the semiconductor fin to define respective vertical channels and comprise a first doped layer and a second doped layer, respectively, the first and second doping layers having a second conductive type wherein the doped layers of the local bit line and the local source line extend along the direction in an upper portion or a lower portion of the semiconductor fin;
   a first select transistor connecting the bit line with the local bit line;
   a second select transistor connecting the common source line with the local source line;
   a drain select line and a source select line connected to the first select transistor and the second select transistor, respectively, and arranged to intersect the bit line; and
   a plurality of word lines connected to the memory cells to intersect the bit line, between the drain select line and the source select line;
   wherein the semiconductor fin has a top surface and a side surface, and the word lines, the drain select line, and the source select line extend over the top surface and the side surface of the semiconductor fin to intersect the direction.

2. The device of claim 1, further comprising a tunnel insulating layer, a charge storage layer, and a blocking insulating layer between the word lines and the semiconductor fin.

3. The device of claim 1, further comprising an isolation insulating layer provided between the lower portion of the semiconductor fin and lower portions of other semiconductor fins adjacent to the semiconductor fin to extend along the direction,
   wherein the word lines, the drain select line, and the source select line extend over the isolation insulating layer.

4. The device of claim 1, wherein the first doped layer is provided in the upper portion of the semiconductor fin, and the second doped layer is provided in the lower portion of the semiconductor fin;
   the device further comprising a third doped layer and a fourth doped layer spaced apart from each other at both sides of the first doped layer in the upper portion of the semiconductor fin, the third and fourth doped layers having a second conductive type,
   wherein the word lines overlap the first doped layer and the second doped layer, the source select line overlaps the second doped layer and the third doped layer, and the drain select line is provided between the first doped layer and the fourth doped layer.

5. The device of claim 4, further comprising a body isolation line extending over the top surface and the side surface of the semiconductor fin to intersect the direction and overlapping the first doped layer and the second doped layer to deplete a body region between the first doped layer and the second doped layer, between the drain select line and the word line that is the most adjacent to the drain select line.

6. The device of claim 1, wherein the first doped layer is provided in the upper portion of the semiconductor fin, and the second doped layer is provided in the lower portion of the semiconductor fin;
   the device further comprising a third doped layer spaced apart from the first doped layer and having a second conductive type in the upper portion of the semiconductor fin, and
   a fourth doped layer spaced apart from the second doped layer and having a second conductive type in the lower portion of the semiconductor fin,
   wherein the word lines overlap the first doped layer and the second doped layer, the source select line overlaps the second doped layer and the third doped layer, and the drain select line overlaps the first doped layer and the fourth doped layer.

7. The device of claim 1, wherein the first doped layer is provided in the upper portion of the semiconductor fin, and the second doped layer is provided in the lower portion of the semiconductor fin;

the device further comprising a fourth doped layer spaced apart from the first doped layer and having a second conductive type in the upper portion, and a third doped layer spaced apart from the second doped layer and having a second conductive type in the lower portion of the semiconductor fin, wherein the word lines overlap the first doped layer and the second doped layer, the source select line is provided between the second doped layer and the third doped layer, and the drain select line is provided between the first doped layer and the fourth doped layer.

8. The device of claim 1, wherein the first doped layer is provided in the upper portion of the semiconductor fin, and the second doped layer is provided in the lower portion of the semiconductor fin; and the semiconductor substrate includes a buried insulating layer, the buried insulating layer being provided in the lower portion of the semiconductor fin to electrically insulate the semiconductor fin from other semiconductor fins adjacent to the semiconductor fin, and contacting a bottom surface of the second doped layer.

9. The device of claim 8, further comprising:

a third doped layer and a fourth doped layer spaced apart in the both sides of the first doped layer in the upper portion of the semiconductor fin; and a fifth doped layer spaced apart from the second doped layer and contacting the top surface of the buried insulting layer in the lower portion of the semiconductor fin, wherein the word lines overlap the first doped layer and the second doped layer, the source select line overlaps the second doped layer and the third doped layer, and the drain select line is provided between the first doped layer and the fourth doped layer and overlaps the fifth doped layer.

10. The device of claim 1, wherein the first doped layer is provided in the lower portion of the semiconductor fin, and the second doped layer is provided in the upper portion of the semiconductor fin;

the device further comprising a fourth doped layer spaced apart from the second doped layer and having a second conductive type in the upper portion of the semiconductor fin, and a fifth doped layer extending from the third doped layer toward the top surface of the semiconductor fin and having a second conductive type;

wherein the word lines overlap the first doped layer and the second doped layer, the source select line overlaps the second doped layer and the third doped layer, and the drain select line overlaps the first doped layer and the fourth doped layer.

11. The device of claim 10, further comprising:

a body isolation line extending over the top surface and the side surface of the semiconductor fin to intersect the direction and overlapping the first doped layer and the second doped layer to deplete a body region between the first doped layer and the second doped layer, between the source select line and the word line that is the most adjacent to the source select line.

12. The device of claim 1, wherein the width of the semiconductor fin ranges from about 40 nm to about 60 nm.

* * * * *